United States Patent
Han et al.

(10) Patent No.: US 11,843,061 B2
(45) Date of Patent: Dec. 12, 2023

(54) POWER SILICON CARBIDE BASED SEMICONDUCTOR DEVICES WITH IMPROVED SHORT CIRCUIT CAPABILITIES AND METHODS OF MAKING SUCH DEVICES

(71) Applicant: Wolfspeed, Inc., Durham, NC (US)

(72) Inventors: Kijeong Han, Apex, NC (US); Joohyung Kim, Cary, NC (US); Sei-Hyung Ryu, Cary, NC (US)

(73) Assignee: Wolfspeed, Inc., Durham, NC (US)

( * ) Notice: Subject to any disclaimer, the term of this patent is extended or adjusted under 35 U.S.C. 154(b) by 0 days.

(21) Appl. No.: 17/004,531

(22) Filed: Aug. 27, 2020

(65) Prior Publication Data

US 2022/0069138 A1    Mar. 3, 2022

(51) Int. Cl.
*H01L 29/808* (2006.01)
*H01L 29/16* (2006.01)
*H01L 29/66* (2006.01)

(52) U.S. Cl.
CPC ........ *H01L 29/808* (2013.01); *H01L 29/1608* (2013.01); *H01L 29/66893* (2013.01)

(58) Field of Classification Search
CPC .............. H01L 29/808; H01L 29/1058; H01L 29/1066; H01L 29/66893–66924; H01L 29/8086; H01L 2924/13062; H01L 27/098; H01L 27/14679; H01L 29/04–045; H01L 29/16–1608; H01L 29/18–185; H01L 29/22–2206; H01L 29/36–365; H01L 21/0465; H01L 29/0688; H01L 29/0878;

(Continued)

(56) References Cited

U.S. PATENT DOCUMENTS 8,866,150 B2   10/2014   Das et al.
9,142,668 B2    9/2015   Cheng et al.

(Continued)

FOREIGN PATENT DOCUMENTS

JP    2011165861 A    8/2011
JP    2012235002 A    11/2012

OTHER PUBLICATIONS

"Notification of Transmittal of the International Search Report and the Written Opinion of the International Searching Authority, or the Declaration for corresponding International Application No. PCT/US2021/046072, dated Jan. 24, 2022, (21 pages)".

(Continued)

*Primary Examiner* — Moin M Rahman
(74) *Attorney, Agent, or Firm* — Myers Bigel, P.A.

(57) ABSTRACT

A power semiconductor device has a semiconductor layer structure that includes a silicon carbide drift region having a first conductivity type, first and second wells in the silicon carbide drift region that are doped with dopants having a second conductivity type, and a JFET region between the first and second wells. The first and second wells each include a main well and a side well that is between the main well and the JFET region, and each side well includes a respective channel region. A doping concentration of the JFET region exceeds a doping concentration of the silicon carbide drift region, and a minimum width of an upper portion of the JFET region is greater than a minimum width of a lower portion of the JFET region.

27 Claims, 10 Drawing Sheets

(58) Field of Classification Search
CPC ............ H01L 29/0886; H01L 29/1095; H01L 29/66068; H01L 29/7802
See application file for complete search history.

(56) References Cited

U.S. PATENT DOCUMENTS

| | | | |
|---|---|---|---|
| 9,240,476 B2 | 1/2016 | Pala et al. | |
| 10,115,815 B2 | 10/2018 | Zhang et al. | |
| 10,424,660 B2 | 9/2019 | Zhang et al. | |
| 2004/0119076 A1* | 6/2004 | Ryu | H01L 29/0878 257/77 |
| 2007/0278571 A1* | 12/2007 | Bhalla | H01L 29/42372 257/341 |
| 2013/0034941 A1* | 2/2013 | Dhar | H01L 21/3115 438/770 |
| 2015/0084063 A1* | 3/2015 | Van Brunt | H01L 29/872 257/77 |
| 2018/0233564 A1* | 8/2018 | Kumada | H01L 29/36 |
| 2019/0198656 A1* | 6/2019 | Zhang | H01L 29/086 |

OTHER PUBLICATIONS

"International Preliminary Report on Patentability for International Patent Application No. PCTUS21046072, dated Mar. 9, 2023, 16 pages".

* cited by examiner

POWER SILICON CARBIDE BASED SEMICONDUCTOR DEVICES WITH IMPROVED SHORT CIRCUIT CAPABILITIES AND METHODS OF MAKING SUCH DEVICES

FIELD

The present invention relates to semiconductor devices and, more particularly, to power semiconductor devices.

BACKGROUND

The Metal Oxide Semiconductor Field Effect Transistor ("MOSFET") is a well-known type of transistor that may be used as a switching device. A MOSFET includes a source region and a drain region that are separated by a channel region, and a gate electrode that is separated from the channel region by a thin gate insulating layer, such as a silicon oxide layer. A MOSFET may be turned on or off by applying a gate bias voltage to the gate electrode. When a MOSFET is turned on by application of a gate bias voltage that is greater than or equal to a "threshold" voltage for the device, current is conducted through the channel region of the MOSFET between the source region and the drain region. When the bias voltage is removed from the gate electrode (or reduced below the threshold voltage level), the current ceases to conduct through the channel region. By way of example, an n-type MOSFET has n-type source and drain regions and a p-type channel. An n-type MOSFET may be designed to turn on when a gate bias voltage is applied to the gate electrode that is sufficient to create a conductive n-type inversion layer in the p-type channel region that electrically connects the n-type source and drain regions, thereby allowing for majority carrier conduction therebetween. MOSFETs may also be designed as "normally-on" devices that are turned off by application of a gate bias voltage to the gate electrode.

Because the gate electrode of the MOSFET is insulated from the channel region by the gate insulating layer, minimal gate current is required to maintain the MOSFET in its on-state or to switch the MOSFET between its on-state and its off-state. The gate current is kept small during switching because the gate electrode forms a capacitor with the channel region. Thus, only minimal charging and discharging current is required during switching, allowing for less complex gate drive circuitry.

There is an increasing demand for high power MOSFETs and other gate electrode controlled semiconductor devices that can pass large currents (e.g., hundreds of Amps) in their "on" state and block large voltages (e.g., thousands of volts) in their reverse blocking state. In order to support high current densities and block such high voltages, power MOSFETs typically have a vertical structure with the source and drain on opposite sides of a thick semiconductor layer structure. In very high power applications, power MOSFETs are typically formed in wide band-gap semiconductor material systems. Herein, the term "wide band-gap semiconductor" encompasses any semiconductor having a band-gap of at least 1.4 eV such as, for example, silicon carbide (SiC). Silicon carbide has a number of advantageous characteristics including, for example, a high electric field breakdown strength, high thermal conductivity, high electron mobility, high melting point and high-saturated electron drift velocity. Relative to devices formed in other semiconductor materials such as, for example, silicon, electronic devices formed in silicon carbide may have the capability of operating at higher temperatures, at high power densities, at higher speeds, at higher power levels and/or under higher radiation densities.

SUMMARY

Pursuant to some embodiments of the present invention, power semiconductor devices are provided that have a semiconductor layer structure that includes a silicon carbide drift region having a first conductivity type, a first well located in an upper portion of the silicon carbide drift region, the first well doped with dopants having a second conductivity type that is different than the first conductivity type, a second well located in the upper portion of the silicon carbide drift region, the second well spaced apart from the first well, the second well doped with dopants having the second conductivity type, and a JFET region in the silicon carbide drift region between the first well and the second well. A doping concentration of the JFET region exceeds a doping concentration of the silicon carbide drift region, and a maximum width of an upper half of the JFET region is at least 30% larger than a minimum width of a lower half of the JFET region.

In some embodiments, the first well may include a first main well and a first side well that is between the first main well and the JFET region, and the second well may include a second main well and a second side well that is between the second main well. The first side well may include a first channel region, and the second side well may include a second channel region In some embodiments, a depth of the first side well from an upper surface of the semiconductor layer structure is at least 1.0 micron.

In some embodiments, the power semiconductor device may further include a first source/drain contact on a lower surface of the silicon carbide drift region, a source/drain region having the first conductivity type in an upper portion of the first main well and extending to an upper surface of the first well, a second source/drain contact on an upper surface of the source/drain region, a gate insulating layer on the JFET region and on the first well, and a gate electrode on the gate insulating layer.

In some embodiments, a depth of the JFET region from the upper surface of the semiconductor layer structure may equal or exceed a depth of the first side well from the upper surface of the semiconductor layer structure.

In some embodiments, a peak doping concentration of the first side well may exceed $5 \times 10^{17}/cm^3$ and occurs at a depth of between 0.8 and 1.2 microns below an upper surface of the semiconductor layer structure.

In some embodiments, a depth of the first side well from the upper surface of the semiconductor layer structure may be less than 1.6 microns.

In some embodiments, a depth of the JFET region from the upper surface of the semiconductor layer structure may be between 1.0 and 1.2 times a depth of the first side well from the upper surface of the semiconductor layer structure.

In some embodiments, a peak doping concentration of an upper 0.2 microns of the first side well may be at least an order of magnitude less than a peak doping concentration of the first side well.

In some embodiments, the maximum width of the upper portion of the JFET region may be at least 50% greater than the minimum width of the lower portion of the JFET region.

In some embodiments, a peak doping concentration of the first side well may occur at a first depth from an upper surface of the semiconductor layer structure, and the doping concentration of the JFET region at the first depth from the upper surface of the semiconductor layer structure may be at least an order of magnitude lower than the peak doping concentration of the first side well.

In some embodiments, a depth of the first side well may be between 1.0 and 1.5 microns from an upper surface of the semiconductor layer structure, a depth of the JFET region from the upper surface of the semiconductor layer structure may be between 1.0 and 1.7 microns, and the depth of the JFET region may be at least as deep as the depth of the first side well.

In some embodiments, a distance between the first and second side wells may be less than 1.5 microns.

In some embodiments, the JFET region may comprise an implanted region that is implanted with dopants having the first conductivity type.

In some embodiments, the maximum width of the upper half of the JFET region may be between 40% and 80% larger than the minimum width of the lower half of the JFET region.

In some embodiments, the width of the lower half of the JFET region may be less than 50% the depth of the JFET region.

In some embodiments, the JFET region may extend underneath the first well.

Pursuant to further embodiments of the present invention, power semiconductor devices are provided that have a semiconductor layer structure that includes a silicon carbide drift region having a first conductivity type, a first well located in an upper portion of the silicon carbide drift region, the first well doped with dopants having a second conductivity type that is different than the first conductivity type, a second well located in the upper portion of the silicon carbide drift region, the second well spaced apart from the first well, the second well doped with dopants having the second conductivity type, and a JFET region in the silicon carbide drift region between the first well and the second well. A depth of the JFET region from the upper surface of the semiconductor layer structure exceeds a depth of the first well from the upper surface of the semiconductor layer structure and a maximum width of an upper half of the JFET region is greater than a minimum width of a lower half of the JFET region.

In some embodiments, a doping concentration of the JFET region may exceed a doping concentration of the silicon carbide drift region and a depth of the first well from an upper surface of the semiconductor layer structure may be at least 1.0 micron and a peak doping concentration of the first well exceeds a doping concentration of the first well at a depth of 0.2 microns from an upper surface of the semiconductor layer structure by at least an order of magnitude.

In some embodiments, the peak doping concentration of the first well may exceed $5\times10^{17}/cm^3$ and occurs at a depth of between 0.8 and 1.2 microns below the upper surface of the semiconductor layer structure.

In some embodiments, a depth of the first well from the upper surface of the semiconductor layer structure may be between 1.0 and 1.6 microns.

In some embodiments, the depth of the JFET region from the upper surface of the semiconductor layer structure may be less than 1.2 times the depth of the first well from the upper surface of the semiconductor layer structure.

In some embodiments, the maximum width of the upper half of the JFET region may be at least 50% greater than the minimum width of the lower half of the JFET region.

In some embodiments, the peak doping concentration of the first well may occur at a first depth from the upper surface of the semiconductor layer structure, and a doping concentration of the JFET region at the first depth from the upper surface of the semiconductor layer structure may be at least an order of magnitude lower than the peak doping concentration of the first well.

In some embodiments, the maximum width of the upper half of the JFET region may be between 40% and 80% larger than the minimum width of the lower half of the JFET region.

In some embodiments, the JFET region may extend underneath the first well.

Pursuant to still further embodiments of the present invention, power semiconductor devices are provided that have a semiconductor layer structure that includes a silicon carbide drift region having a first conductivity type, a first well located in an upper portion of the silicon carbide drift region, the first well doped with dopants having a second conductivity type that is different than the first conductivity type, a second well located in the upper portion of the silicon carbide drift region, the second well spaced apart from the first well, the second well doped with dopants having the second conductivity type, and a JFET region in the silicon carbide drift region between the first well and the second well. A doping concentration of the JFET region exceeds a doping concentration of the silicon carbide drift region. A peak doping concentration of the first well occurs at a first depth from an upper surface of the semiconductor layer structure, and the doping concentration of the JFET region at the first depth is at least an order of magnitude lower than the peak doping concentration of the first well. A depth of the JFET region from the upper surface of the semiconductor layer structure exceeds a depth of the first well from the upper surface of the semiconductor layer structure.

In some embodiments, the peak doping concentration of the first may exceed $5\times10^{17}/cm^3$ and may occur at a depth of between 0.7 and 1.2 microns below the upper surface of the semiconductor layer structure.

In some embodiments, the depth of the JFET region from the upper surface of the semiconductor layer structure may be less than 1.2 times the depth of the first well from the upper surface of the semiconductor layer structure.

In some embodiments, a peak doping concentration of an upper 0.2 microns of the first well may be at least an order of magnitude less than the peak doping concentration of the first well.

In some embodiments, a maximum width of an upper half of the JFET region may be at least 50% greater than a minimum width of a lower half of the JFET region.

In some embodiments, the JFET region may comprise an implanted region that is implanted with the first conductivity type dopants.

In some embodiments, the JFET region may extend underneath the first well.

Pursuant to additional embodiments of the present invention, methods of forming power semiconductor devices are provided. Pursuant to these methods, a silicon carbide drift region is provided that has a first conductivity type. Second conductivity type dopants are implanted into an upper portion of the silicon carbide drift region to form first and second wells. First conductivity type dopants are implanted into the upper portion of the silicon carbide drift region that is between the first and second wells via ion implantation to form a JFET region between the first and second wells, where the silicon carbide drift region and the first and second wells are part of a semiconductor layer structure. A minimum width of an upper half of the JFET region is at least 30% larger than a minimum width of a lower half of the JFET region.

In some embodiments, the first well may include a first main well and a first side well that is between the first main well and the JFET region, the first side well including a first channel region, and the second well may include a second main well and a second side well that is between the second main well and the JFET region, the second side well including a second channel region, and a depth of the first side well from an upper surface of the semiconductor layer structure may be at least 1.0 micron.

In some embodiments, a peak doping concentration of the first side well may exceed $5 \times 10^{17}/cm^3$ and may occur at a depth of between 0.8 and 1.2 microns below the upper surface of the semiconductor layer structure.

In some embodiments, the depth of the JFET region from the upper surface of the semiconductor layer structure may be between 1.0 and 1.2 times a depth of the first side well from the upper surface of the semiconductor layer structure.

In some embodiments, a peak doping concentration of an upper 0.2 microns of the first side well may be at least an order of magnitude less than a peak doping concentration of the first side well.

In some embodiments, the JFET region may be formed prior to formation of the first and second wells.

In some embodiments, the JFET region may extend underneath the first and second wells.

DETAILED DESCRIPTION

Power silicon carbide MOSFETs are in use today for applications requiring high voltage blocking such as blocking thousands of volts. By way of example, silicon carbide MOSFETs are commercially available that are rated for current densities of 10 A/cm$^2$ or more that will block voltages of at least 10 kV. To form such devices, a plurality of "unit cell" MOSFET transistors are typically formed that are electrically connected in parallel. In high power applications, a large number of these unit cells (e.g., hundreds or thousands) are typically provided on a single semiconductor substrate, and a gate electrode pattern is formed on a top side of the semiconductor substrate that acts as the gate electrode for all of the unit cells. The opposite (bottom) side of the semiconductor substrate acts as a common drain for all of the units cells of the device. A plurality of source contacts are formed on source regions in the semiconductor layer structure that are exposed within openings in the gate electrode pattern. These source contacts are also electrically connected to each other to serve as a common source. The resulting device has three terminals, namely a common source terminal, a common drain terminal and a common gate electrode that act as the terminals for all of the individual unit cell transistors. It will be appreciated that the above description is of an n-type MOSFET; the locations of the drain and source would be reversed for a p-type MOSFET.

There is continued demand to improve the performance of power MOSFETs and other gate-controlled power semiconductor devices. Several important performance parameters of a power MOSFET are the mobility of the carriers in the channel region, the threshold voltage, the on-state resistance, the high frequency switching speed, device reliability and the "short circuit capability" of the device.

Figure 1A:
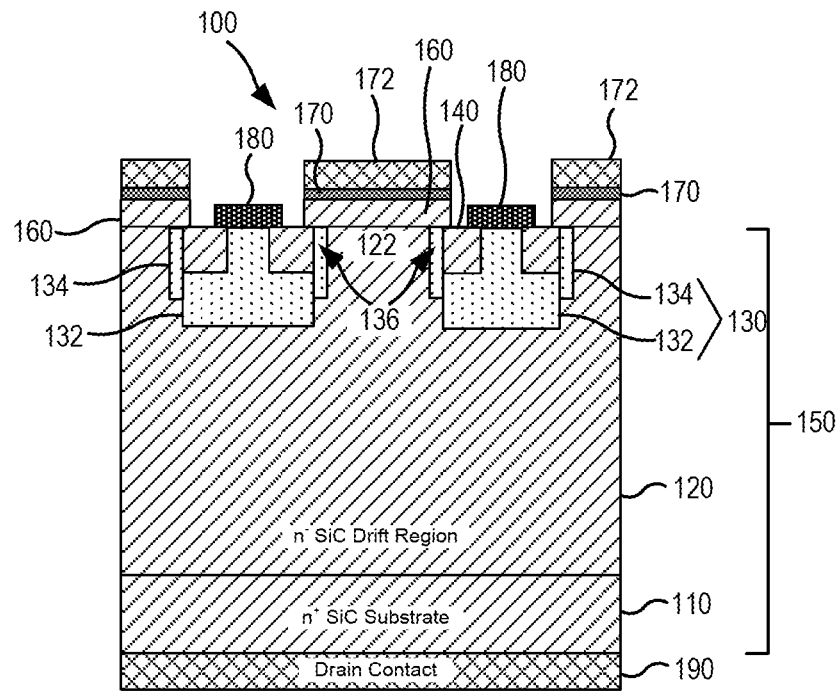
FIG. 1A is a schematic cross-sectional view of a unit cell of a conventional power MOSFET.
Figure 1B:
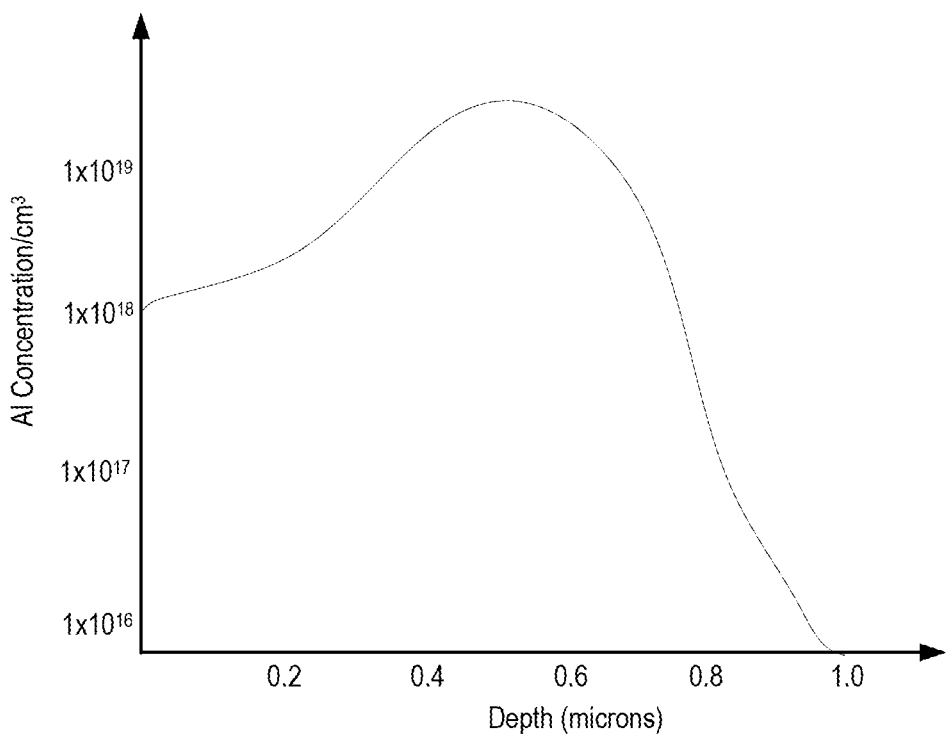
FIG. 1B is a graph showing the doping profile of the side p-wells of the unit cell of FIG. 1A as a function of depth.

FIG. 1A is a schematic cross-sectional view of a unit cell transistor 100 of a conventional silicon carbide power MOSFET (FIG. 1A also shows portions of two adjacent unit cells). FIG. 1B is a graph showing the doping profile of the side p-wells of the unit cell transistor 100 as a function of depth from a top surface of a semiconductor layer structure of the device.

As shown in FIG. 1A, the unit cell transistor 100 includes an n-type silicon carbide semiconductor substrate 110. A lightly-doped n-type (n$^-$) silicon carbide drift region 120 is provided on the substrate 110. Upper portions of the n-type silicon carbide drift region 120 may be doped p-type by ion implantation to form p-wells 130. Each p-well 130 includes a main p-well 132 and a pair of side p-wells 134. The main p-wells 132 have a doping concentration between $5 \times 10^{18}/cm^3$ and $5 \times 10^{19}/cm^3$. The dopant concentration is generally higher the deeper the p-well 132 extends into the silicon carbide drift region 120. The side p-wells 134, which serve as the channels regions 136 for the unit cell 100, are more lightly doped with p-type dopants than the main p-wells 132. The doping concentration profile of each side p-well 134 is shown in FIG. 1B (discussed below). Each p-well 130 is formed by ion implantation using two ion implantation steps.

Heavily-doped (n$^+$) n-type silicon carbide source regions 140 are formed in upper portions of the p-wells 130. The n-type source regions 140 may also be formed by ion implantation. The heavily-doped (n$^+$) n-type silicon carbide regions 140 act as source regions for the unit cell transistor 100. The drift region 120 and the substrate 110 together act as a common drain region for the unit cell transistor 100. The n-type silicon carbide substrate 110, n-type silicon carbide drift region 120, the p-wells 130 and the n-type source regions 140 formed therein may together comprise a semiconductor layer structure 150 of the unit cell transistor 100.

An n-type epitaxial pattern 160 is formed on the semiconductor layer structure 150. The n-type epitaxial pattern 160 may have a low doping concentration (e.g., between $1\times10^{16}/cm^3$ and $1\times10^{17}/cm^3$). The n-type epitaxial pattern 160 may be, for example, 0.5 to 1.5 microns thick. A silicon oxide gate insulating layer 170 is formed on the upper surface of the n-type epitaxial pattern 160. A gate electrode 172 is formed on the gate insulating layer 170 opposite the n-type epitaxial pattern 160. Source contacts 180 are formed within openings in the n-type epitaxial pattern 160 so as to contact the heavily-doped n-type source regions 140. A drain contact 190 is formed on the lower surface of the substrate 110.

As noted above, channel regions 136 are provided in the side p-wells 134. The channel regions 136 electrically connect the n-type source regions 140 to the drift region 120 when a sufficient bias voltage is applied to the gate electrode 172. When such a bias voltage is applied to the gate electrode 172, current may flow from the n-type source regions 140 through the channel regions 136 to the portion of the drift region 120 that is underneath the gate electrode 172, which is referred to as a "JFET region" 122 of the device.

FIG. 1B is a graph showing the doping profile of the side p-well 134 of the unit cell transistor 100 as a function of depth from the upper surface of the semiconductor layer structure 150. The p-wells 130 are formed by implanting aluminum ions into the silicon carbide drift region 120. As shown in FIG. 1B, the side p-well 134 may have a graded doping profile with a doping concentration of aluminum ions of about $1\times10^{18}/cm^3$ at the upper surface of the side p-well 134, which then increases to almost $5\times10^{19}/cm^3$ at a depth of about 0.5 microns from the n-type epitaxial pattern 160 and the doping concentration decreases rapidly with increasing depth. The side p-wells 134 may be implanted using a relatively low implantation energy (e.g., 300-350 keV) since a relatively high doping concentration is provided at the surface of the side p-wells 134.

As noted above, two important performance parameters for a power MOSFET are the mobility of the carriers in the channel regions of the unit cell transistors and the threshold voltage of the device. The doping profile of the channel regions 136 may have a significant impact on both of these performance parameters. In order to have high channel mobility it may be desirable to have a low doping concentration directly under the gate insulating layer 170. Providing the relatively lightly-doped n-type epitaxial pattern 160 directly under the gate insulating layer 170 may therefore improve channel mobility. Such a design also results in a low threshold voltage. Additionally, since the ion implantation damage will not be directly under the gate insulating layer 170, the damage caused by such ion implantation is farther removed from the gate insulating layer 170 and hence may have less impact on device performance.

A MOSFET that is formed of the unit cell transistors 100 may exhibit good performance. However, the MOSFET may be expensive to make as it requires growing a first set of semiconductor layers, removing the structure from the growth reactor to form the p-wells 130 and n-type source regions 140 via ion implantation, and then placing the structure back into the growth reactor to form the n-type epitaxial pattern 160.

Figure 2A:
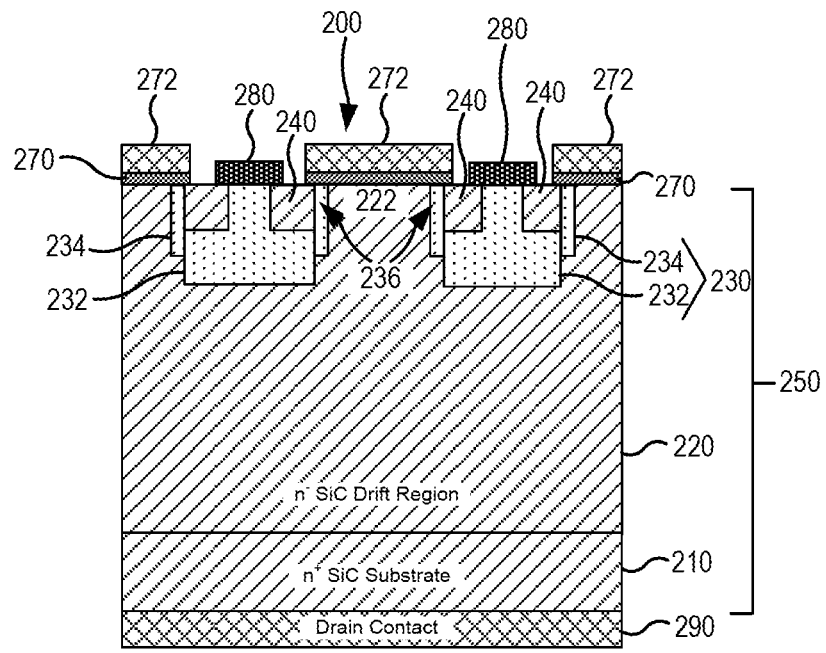
FIG. 2A is a schematic cross-sectional view of a unit cell of another conventional power MOSFET.

FIG. 2A is a schematic cross-sectional view of a unit cell 200 (and portions of two additional unit cells) of another conventional silicon carbide power MOSFET. As shown in FIG. 2A, the unit cell transistor 200 includes an n-type silicon carbide semiconductor substrate 210 and a lightly-doped n-type (n⁻) silicon carbide drift region 220 that is provided on an upper surface of the substrate 210. Upper portions of the n-type silicon carbide drift region 220 are doped p-type by ion implantation to form p-wells 230 that each comprise a main p-well 232 and a pair of side p-wells 234. Heavily-doped (n⁺) n-type silicon carbide source regions 240 are formed by ion implantation in upper portions of the p-wells 230. The substrate 210, drift region 220, p-wells 230 and n source regions 240 may together comprise a semiconductor layer structure 250 of the unit cell transistor 200. A gate insulating pattern 270 is formed on the semiconductor layer structure 250. A gate electrode 272 is formed on the gate insulating layer 270. Source contacts 280 are formed on the source regions 240, and a drain contact 290 is formed on the lower surface of the substrate 210. Channel regions 236 are provided in the side p-wells 234 that electrically connect the source regions 240 to the drift region 220 when a sufficient bias voltage is applied to the gate electrode 272.

The unit cell transistor 200 has a structure that is similar to the structure of the unit cell transistor 100 of FIG. 1A, except that the n-type epitaxial pattern 160 of unit cell transistor 100 is omitted in unit cell transistor 200. Additionally, the dimensions and doping concentrations of various of the regions of unit cell transistor 200 differ from the dimensions and doping concentrations of the corresponding regions in unit cell transistor 100.

Figure 2B:
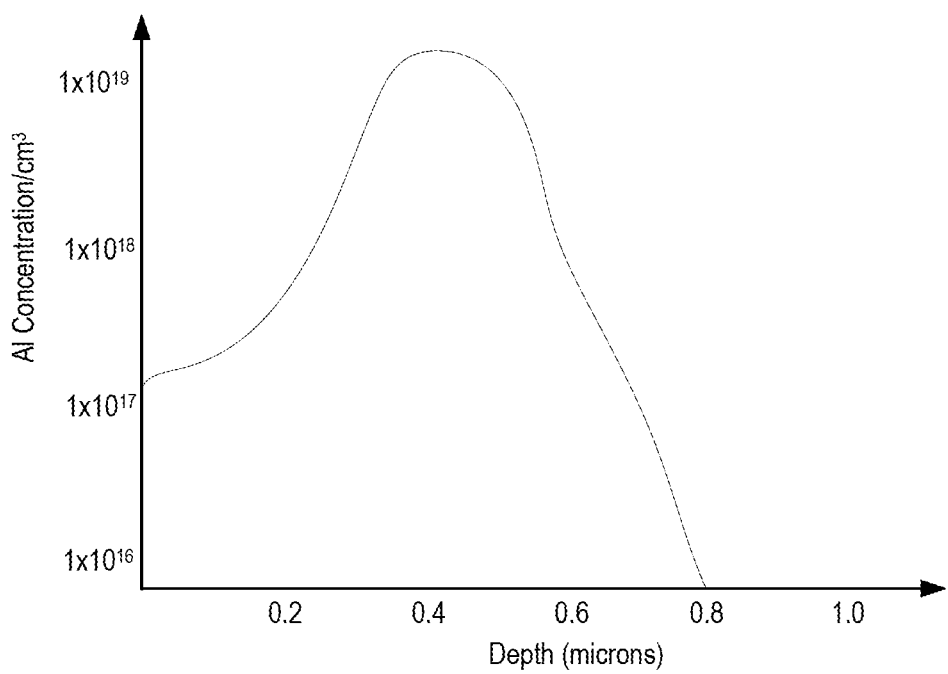
FIG. 2B is a graph showing the doping profile of the side p-wells of the unit cell of FIG. 2A as a function of depth.

FIG. 2B is a graph showing the doping profile of the side p-well 234 of the unit cell transistor 200 as a function of depth from the upper surface of the semiconductor layer structure 250. As shown in FIG. 2B, the dopant concentration of the channel region 236 just below the surface of the semiconductor layer structure 250 is about $1\times10^{17}/cm^3$. The dopant concentration increases to a peak doping concentration of about $1\times10^{19}/cm^3$ at a depth of about 0.5 microns below the surface of the semiconductor layer structure 250. The doping concentration then decreases, falling below $1\times10^{17}/cm^3$ at a depth of about 0.7 microns.

A power MOSFET formed of the unit cell transistors 200 may exhibit good performance, although the performance may not be as good as the performance of a power MOSFET formed of the unit cell transistors 100 of FIG. 1A. A drop-off in performance may result for the power MOSFET formed of the unit cell transistors 200 because the p-wells 230 may be formed via a higher energy ion implantation process (e.g., the implantation energy may be about 450 keV), which may result in increased damage to the semiconductor layer structure 250. In addition, the damage to the semiconductor lattice may be immediately underneath the gate insulating layer 270 where damage may have the greatest impact on device performance. In addition, the doping profile of FIG. 2B may be inferior to the doping profile of FIG. 1B and a corresponding reduction in performance may result. However, the power MOSFET formed of the unit cell transistors 200 may be significantly less expensive to fabricate as compared to the power MOSFET formed of the unit cell transistors 100.

Another potential issue with a power MOSFET formed of the unit cell transistors 200 is that it may exhibit reduced "short circuit capability" as compared to the power MOSFET formed of the unit cell transistors 100. The "short circuit capability" of a power MOSFET (or other gate-controlled power semiconductor device) refers to the time that the device can operate when subjected to short circuit conditions before the device is damaged or destroyed. Under short circuit conditions, the drain current increases dramatically. The high drain current causes a spike in the internal temperature of the device due to the large amount of power dissipated in the semiconductor layer structure as the high current passes through the device. How quickly the device heats up under short circuit conditions is a function of the heat dissipation characteristics of the device packaging and the operating conditions. For example, if a power MOSFET formed of the unit cells 200 conducts 500 amps at a voltage of 1200 volts, the power is 1200V*500 A=60 kilowatts. A power MOSFET with typical packaging may have a thermal impedance of, for example, 0.01° C./W. Thus, for such a MOSFET, operation at 60 kilowatts will heat the device up to about 600° C. (60 kilowatts*0.01° C./W=600° C.). Typically, a MOSFET may only sustain such temperatures without failing for a very short period of time such as, for example, 1 microsecond. In contrast, the same MOSFET might be able to operate at 200° C. for ten hours without failing.

In order to protect a MOSFET against such failure, a control circuit may be provided that senses when a short circuit condition is occurring and lowers the gate voltage (e.g., to 0 volts) in response thereto. The short circuit condition is not a normal operating condition and typically occurs because a larger system that includes the MOSFET is not operating as intended. The short circuit capability of a MOSFET is important, however, because when a short circuit condition occurs the control system must be able to shut off the gate voltage quickly to prevent failure of the device. The shorter the duration of the short circuit capability, the faster the control circuit must be able to operate.

Figure 3A:
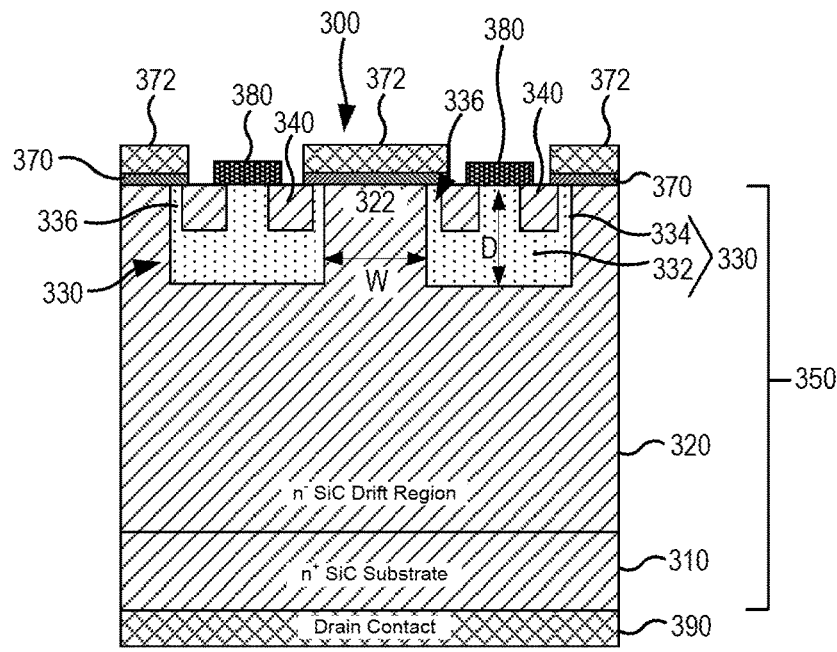
FIG. 3A is a schematic cross-sectional view of a unit cell of yet another conventional power MOSFET.

FIG. 3A is a schematic cross-sectional view of a unit cell 300 (and portions of two additional unit cells) of another conventional silicon carbide power MOSFET that is designed to have improved short circuit performance.

As shown in FIG. 3A, the unit cell transistor 300 includes an n-type silicon carbide semiconductor substrate 310 and a lightly-doped n-type (n⁻) silicon carbide drift region 320 that is provided on an upper surface of the substrate 310. Upper portions of the n-type silicon carbide drift region 320 are doped p-type by ion implantation to form p-wells 330 that each comprise a main p-well 332 and a pair of side p-wells 334. Heavily-doped (n⁺) n-type silicon carbide source regions 340 are formed by ion implantation in upper portions of the p-wells 330. A JFET region 322 is defined between the p-wells 330 in the upper portion of the drift region 320. The substrate 310, drift region 320 (including the JFET region 322), p-wells 330 and source regions 340 may together comprise a semiconductor layer structure 350 of the unit cell transistor 300. A gate insulating layer 370 is formed directly on the upper surface of the semiconductor layer structure 350. A gate electrode 372 is formed on the gate insulating layer 370. Source contacts 380 are formed on the heavily-doped n-type source regions 340 and the p-wells 330. A drain contact 390 is formed on the lower surface of the substrate 310.

The p-wells 330 are formed via channeled ion implantation, which allows forming deep p-wells 330 while at the same time using relatively low implantation energies. The use of channeled ion implantation also allows the upper portion of the semiconductor layer structure 350 to be only lightly doped p-type, or even to remain n-type. The side wells 334 and the main wells 332 may have the same or different doping profiles. If different doping profiles are provided, the main wells 332 may be more heavily doped than the side wells 334. At least the side wells 334 are formed using low energy channeled ion implantation techniques. The p-wells 330 may have depths D of 1.5 microns to 6.0 microns or more. The width W of the JFET region 322 is made larger than normal due to the increased depth of the p-wells 330.

Figure 3B:
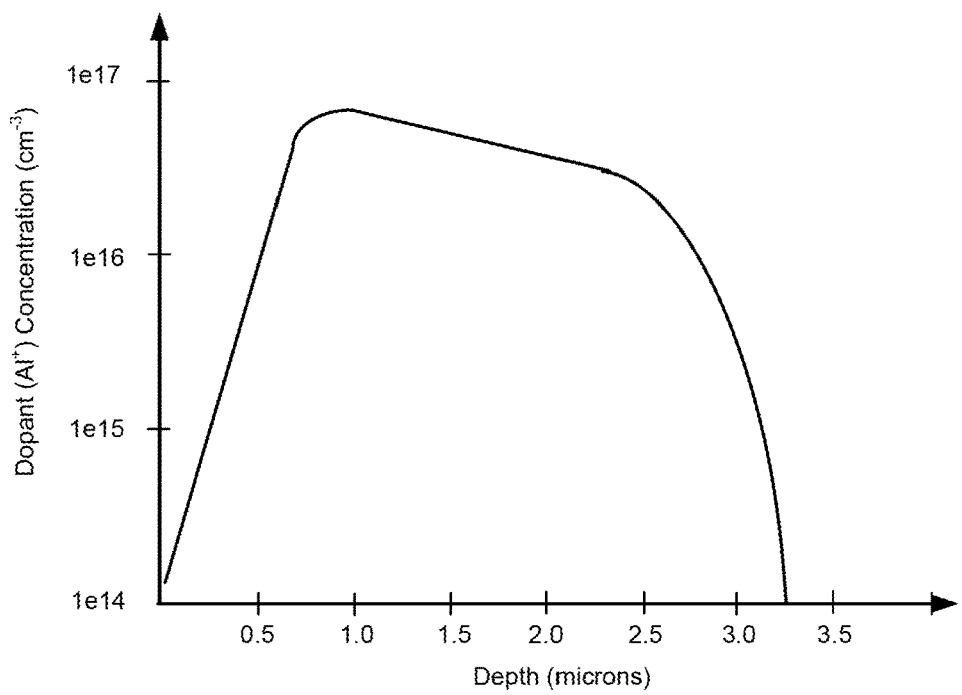
FIG. 3B is a graph showing the doping profile of the side p-wells of the unit cell of FIG. 3A as a function of depth.

FIG. 3B is a graph showing the (p-type dopant) doping profile of a side well 334 of the unit cell transistor 300 as a function of depth D from a top surface of the semiconductor layer structure 350. As shown in FIG. 3B, the p-type dopant concentration just below the surface of the side p-well 334 may be very low, under $1 \times 10^{15}/cm^3$. The p-type dopant concentration sharply increases throughout the first 0.9 microns to a peak doping concentration of about $8 \times 10^{16}/cm^3$ at a depth of about 0.9 microns from the top surface of the semiconductor layer structure 350. The doping concentration then very gradually decreases to a doping concentration of about $3 \times 10^{16}/cm^3$ at a depth of about 2.8 microns. The doping concentration then decreases rapidly, falling below the detection level by a depth of 3.5 microns.

While the device of FIG. 3A may exhibit improved shot circuit capability, the device is formed using channeled ion implantation which requires specialized equipment and increases the manufacturing time. Additionally, the maximum doping concentration achievable using channeled ion implantation is about $1 \times 10^{17}/cm^3$, which may be insufficient to deplete the JFET region 322 of the device under short circuit operating conditions. The MOSFET of FIG. 3A also has widened JFET regions 322 which reduces the number of unit cells that can be formed in a given region of a wafer.

Pursuant to embodiments of the present invention, power MOSFETs and other gate-controlled devices are provided that may exhibit improved short circuit capability while still providing very high levels of performance in terms of blocking voltage, switching time and on-state resistance. This improved performance may be achieved by using high-energy ion implantation to form relatively deep p-wells having highly-doped bottom portions within the semiconductor layer structure of the device. The high-doping levels at the bottoms of the p-wells results in the lower portions of the p-wells spreading laterally, reducing the width of at least part of the lower portion of the JFET regions. The deeper, highly-doped p-wells and the reduced width of the lower portion of the JFET region increase the size and width of the depletion region that is formed in the JFET region, providing better pinch-off effects, which reduces the saturation drain current. The lower saturation current reduces the power dissipation within the device when operating under short circuit conditions, and hence reduces the rise in the internal temperature of the device. Thus, the short-circuit capabilities of the device may be improved as compared to conventional devices.

The narrowing of the lower portion of the JFET region that results from the higher doping levels in the lower portions of the p-wells may act to increase the specific on-resistance of the device, which is undesirable. In order to counteract the increase in the on-resistance, the doping concentration of the JFET region may be increased above conventional levels, and the depth of the JFET region may be increased. For example, the JFET region may be at least as deep as the deep p-wells. This deeper, more highly doped JFET region may mitigate the increase in the specific on-resistance of the device. The deeper, more highly doped JFET region may also reduce the value of the specific on-resistance at high temperatures, which helps reduce the rate at which the internal temperature of the device increases under short circuit conditions (i.e., the device has a smaller temperature coefficient). This may further improve the short circuit capabilities of the device.

Additionally, the narrowing of the lower portion of the JFET region helps to shield the gate electrode from the drain, resulting in lower intrinsic gate-to-drain capacitance levels for the device. The ratio of the intrinsic gate-to-source capacitance to the intrinsic gate-to-drain capacitance is one of the most important factors for reliable high frequency switching performance, and hence the reduction in the intrinsic gate-to-drain capacitance may improve the performance of the device. Moreover, the deeper, highly-doped p-wells increase the size and width of the depletion region that is formed within the JFET region of the device, which reduces the electric field values in both the JFET region and in the gate insulating layer during operation. Since one known failure mechanisms for power MOSFETs and other gate-controlled switching devices is breakdown of the gate insulating layer due to extended exposure to high electric fields, the improved shielding may increase the lifetime, and hence the reliability, of the devices according to embodiments of the present invention.

Pursuant to some embodiments of the present invention, power semiconductor devices are provided that include a semiconductor layer structure that has a silicon carbide drift region having a first conductivity type (e.g., n-type) and first and second wells located in an upper portion of the drift region, where the first and second wells are doped with dopants having a second conductivity type (e.g., p-type). A JFET region is defined in the silicon carbide drift region between the first and second wells. The first well includes a first main well and a first side well that is between the first main well and the JFET region, and the second well includes a second main well and a second side well that is between the second main well and the JFET region. The first and second side wells include respective first and second channel regions. A doping concentration of the JFET region exceeds a doping concentration of the silicon carbide drift region, and a maximum width of an upper portion of the JFET region is greater than a minimum width of a lower portion of the JFET region. In example embodiments, the maximum width of the upper portion of the JFET region may be at least 30%, at least 40%, at least 50%, at least 60%, at least 80% or at least 100% greater than the minimum width of the lower portion of the JFET region. In such embodiments, the upper portion of the JFET region may be the upper half of the JFET region and the lower portion of the JFET region may be the lower half of the JFET region. For example, the maximum width of the upper half of the JFET region may be between 40%, and 80% greater than the minimum width of the lower half of the JFET region. In each of the above embodiments, the maximum width of the upper portion of the JFET region may be less than three times (i.e., 300%) greater than the minimum width of the lower portion of the JFET region.

In some embodiments, a depth of the JFET region from the upper surface of the semiconductor layer structure may equal or exceed a depth of the first side well from the upper surface of the semiconductor layer structure. The depth of the first side well from an upper surface of the semiconductor layer structure may be between 1.0 and 1.6 microns in some embodiments. The depth of the JFET region from the upper surface of the semiconductor layer structure may be between 1.0 and 1.2 times a depth of the first side well. For example, the depth of the first side well may be between 1 and 1.5 microns from the upper surface of the semiconductor layer structure, the depth of the JFET region may be between 1 and 1.7 microns, and may be at least as deep as the depth of the first side well. The JFET region may extend underneath the side wells in some embodiments.

A peak doping concentration of the first side well may exceed $5\times10^{17}/cm^3$ or even $1\times10^{18}/cm^3$, and may occur at a depth of between 0.8 and 1.2 microns below the upper surface of the semiconductor layer structure in some embodiments. Moreover, a peak doping concentration of the upper 0.2 microns of the first side well may be at least an order of magnitude less than a peak doping concentration of the first side well.

The width of the lower portion of the JFET region may be less than the depth of the JFET region. In example embodiments, the width of the lower portion of the JFET region may be less than 40%, less than 50%, less than 60%, less than 70% or less than 80% the depth of the JFET region. The width of the upper portion of the JFET region may be more or less than the depth of the JFET region. In example embodiments, the width of the upper portion of the JFET region may be between 70% and 130% the depth of the JFET region, between 80% and 120% the depth of the JFET region, or between 90% and 110% the depth of the JFET region.

Example embodiments of power semiconductor devices according to embodiments of the present invention will now be described with reference to FIGS. 4-9F.

Figure 4:
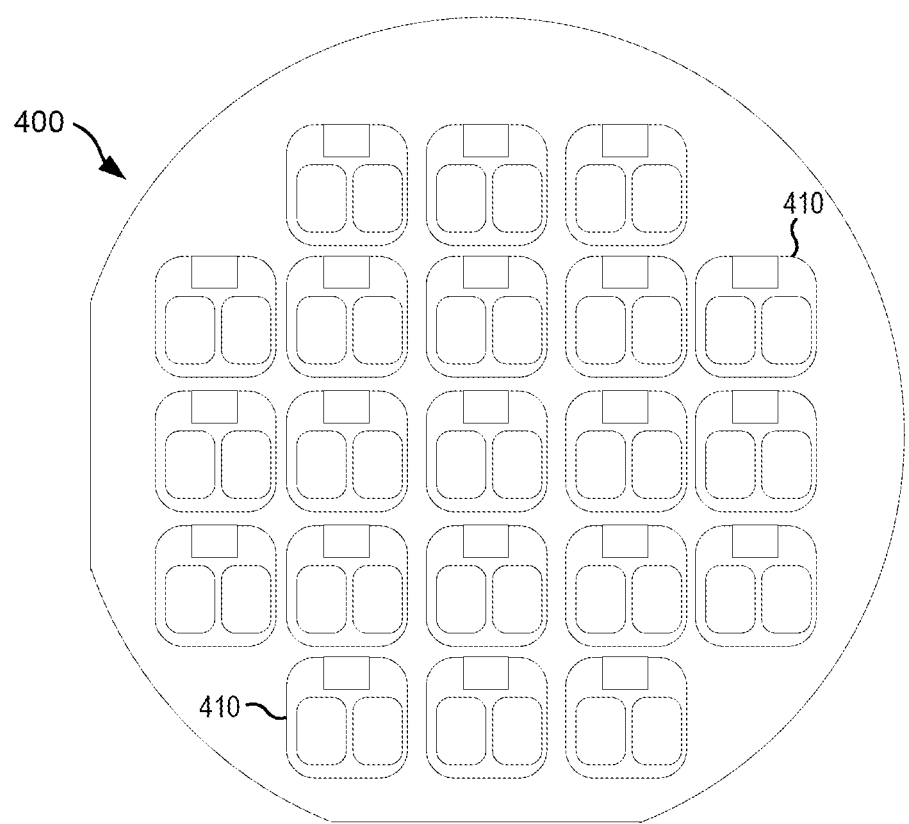
FIG. 4 is a schematic plan view of a semiconductor wafer that includes a plurality of power MOSFETs according to embodiments of the present invention.

FIG. 4 is a schematic plan view of a wafer 400 that includes a plurality of the power MOSFETs 410 according to embodiments of the present invention. The power MOSFETs 410 may be formed in rows and columns and may be spaced apart from each other so that the wafer 400 may later be singulated (e.g., diced) to separate the individual power MOSFETs 410 for packaging and testing. The wafer 400 may comprise, for example, a 4H silicon carbide substrate having one or more silicon carbide layers formed thereon (e.g., by epitaxial growth) in some embodiments. Other semiconductor layers (e.g., polysilicon layers), insulating layers and/or metal layers may be formed on the silicon carbide semiconductor layer structure to form the power MOSFETs 410.

Figure 5A:
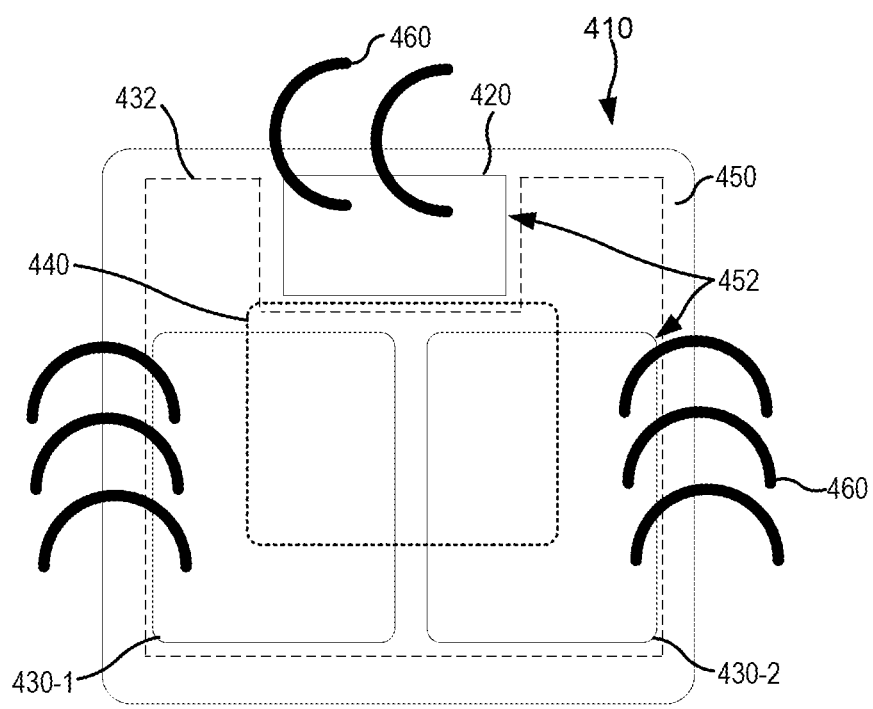
FIG. 5A is a schematic plan view of one of the power MOSFETs included on the semiconductor wafer of FIG. 4.
Figure 5B:
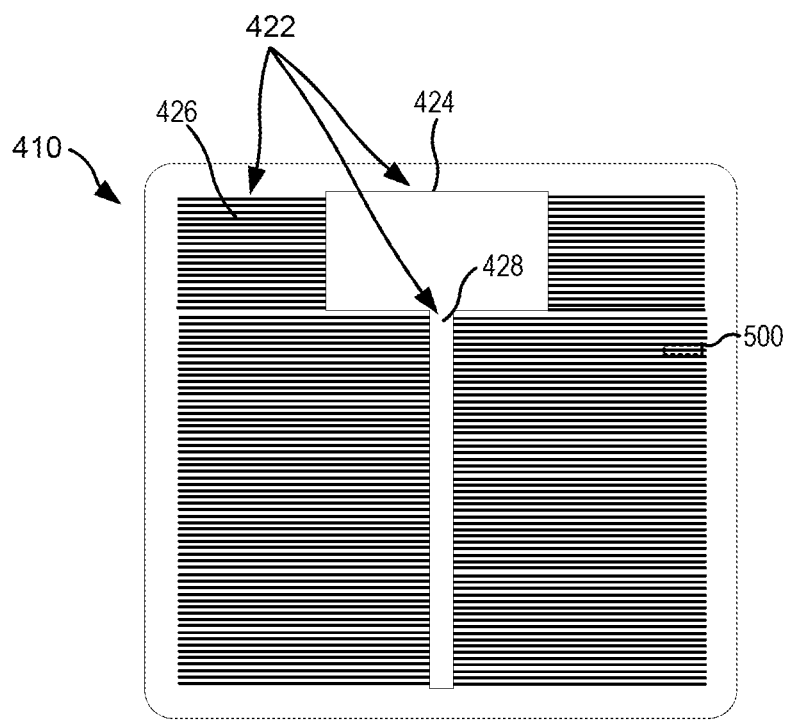
FIG. 5B is a schematic plan view of the power MOSFET of FIG. 5A with the source metallization removed.

FIG. 5A is a schematic plan view of one of the power MOSFETs 410 included on the wafer 400 of FIG. 4. FIG. 5B is a schematic plan view of the power MOSFET 410 of FIG. 5A with the source metallization and gate bond pad removed.

As shown in FIG. 5A, a gate bond pad 420 and one or more source bond pads 430-1, 430-2 may be formed on an upper surface of a semiconductor layer structure of the MOSFET 410. A drain bond pad 440 (shown by a dotted box in FIG. 5A) may be provided on the bottom side of the MOSFET 410. Each bond pad 420, 430, 440 may be formed of a metal, such as aluminum, that bond wires can be readily attached to via conventional techniques such as thermo-compression or soldering.

As will be discussed in more detail below, source contacts are provided that contact source regions in the semiconductor layer structure of the MOSFET 410. The source contacts may be lower portions of a source metal pattern 432 that extends across much of the upper surface of the MOSFET 410. The source metal pattern 432 is indicated by a dashed box in FIG. 5A as significant portions of the source metal pattern 432 are covered by a protective layer 450. The source bond pads 430-1, 430-2 are portions of the source metal pattern 432 that are exposed through openings 452 in the protective layer 450. Bond wires 460 are shown in FIG. 5A that may be used to connect the gate bond pad 420 and the source bond pads 430-1, 430-2 to external circuits or the like.

As is shown in FIG. 5B, a gate electrode pattern 422 may be provided that includes a gate pad 424, a plurality of gate fingers 426, and one or more gate buses 428 that electrically connect the gate fingers 426 to the gate pad 424. The gate pad 424 may be directly underneath and electrically connected to the gate bond pad 420, and the gate fingers 426 may extend horizontally across the device. An insulating layer (not shown) may cover the gate fingers 426 and gate bus(es) 428. The source metal pattern 432 may be formed on the insulating layer over the gate fingers 426. Source contacts of the source metal pattern 432 extend downwardly through openings in the insulating layer (not shown) and between the gate fingers 426 to contact corresponding source regions in the semiconductor layer structure. The MOSFET 410 includes a plurality of unit cell transistors 500 that are arranged in parallel. The location of one unit cell 500 is shown in FIG. 5B to provide context.

Figure 6A:
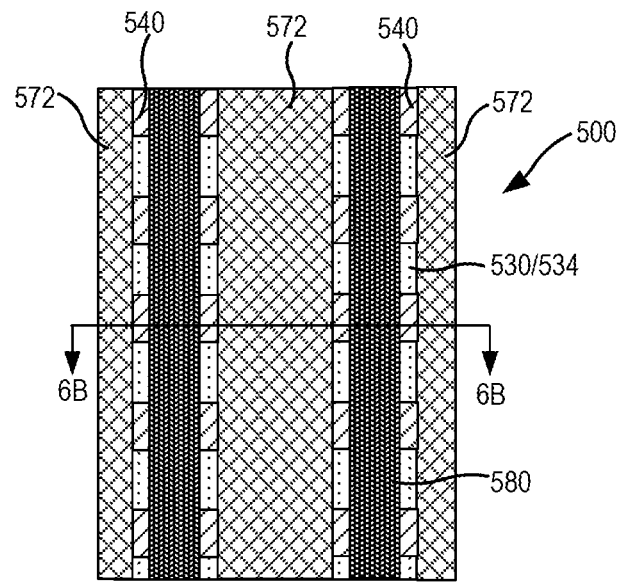
FIG. 6A is a schematic plan view of a portion of a unit cell of the power MOSFET of FIGS. 5A-5B.
Figure 6B:
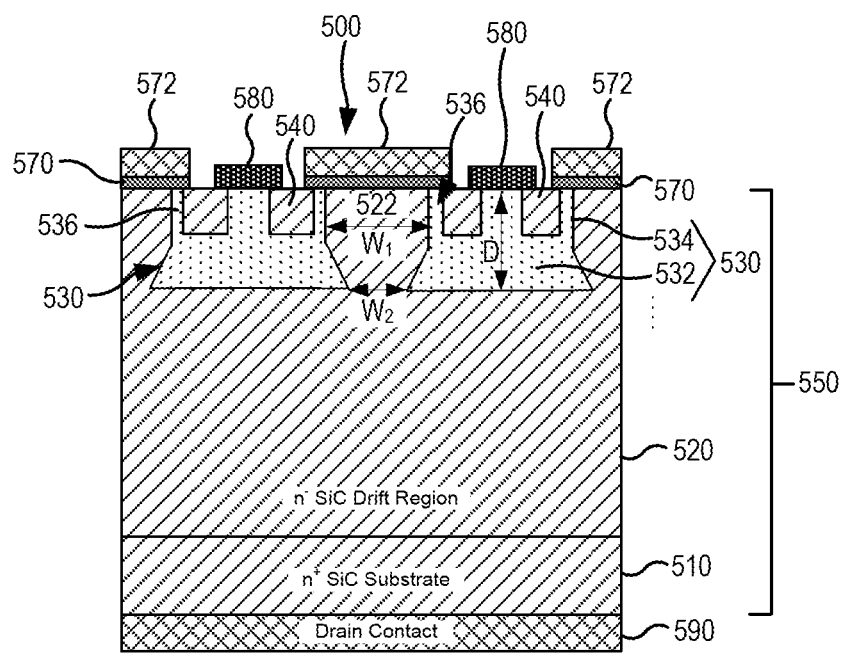
FIG. 6B is a schematic cross-sectional diagram taken along the line 6B-6B of FIG. 6A.

FIG. 6A is a schematic plan view of the unit cell transistor 500 of the power MOSFET 410 of FIGS. 5A-5B. FIG. 6B is a schematic cross-sectional diagram taken along the line 6B-6B of FIG. 6A. It will be appreciated that FIG. 6B illustrates one full unit cell 500 and portions of two additional unit cells on either side thereof in order to provide context.

Referring to FIGS. 6A-6B, the unit cell transistor 500 may be formed on an n-type silicon carbide semiconductor substrate 510 such as, for example, a single crystal 4H silicon carbide semiconductor substrate that is heavily-doped with n-type impurities. The doping concentration of the substrate 510 may be, for example, between $1 \times 10^{18}$ atoms/cm$^3$ and $1 \times 10^{21}$ atoms/cm$^3$, although other doping concentrations may be used. Herein, the "doping concentration" of a semiconductor material refers to the number of dopant atoms that cause the semiconductor material to have a certain conductivity type (i.e., either n-type or p-type) that are present within a cubic centimeter of semiconductor material as measured using standard measurement techniques such as Secondary Ion Mass Spectrometry ("SIMS"). For an n-type semiconductor material, references to the doping concentration refer to the concentration of n-type dopants and for a p-type semiconductor material, references to the doping concentration refer to the concentration of p-type dopants. The substrate 510 may be any appropriate thickness (e.g., between 100 and 500 microns thick). The substrate 510 may be partially or fully removed in some embodiments.

A lightly-doped n-type (n$^-$) silicon carbide drift region 520 is provided on the substrate 510. The n-type silicon carbide drift region 520 may be formed by, for example, epitaxial growth on the silicon carbide substrate 510. The n-type silicon carbide drift region 520 may have, for example, a doping concentration of $1 \times 10^{14}$ to $5 \times 10^{16}$ dopants/cm$^3$. The doping concentration may vary with the voltage blocking rating of the device, with devices having higher voltage blocking ratings typically having lower doping concentrations in the drift region 520. For example, a MOSFET having a voltage blocking rating of 10 kV or more might have a drift region doping concentration of between $1 \times 10^{14}$ to $5 \times 10^{14}$ dopants/cm$^3$, whereas a MOSFET having a voltage blocking rating of 500 V or more might have a drift region doping concentration of between $1 \times 10^{16}$ to $5 \times 10^{16}$ dopants/cm$^3$. The n-type silicon carbide drift region 520 may be a thick region, having a vertical height above the substrate 510 of, for example, 3-100 microns. While not shown in FIG. 6B, in some embodiments, an upper portion of the n-type silicon carbide drift region 520 may be more heavily doped than the remainder of the drift region 520 to provide a current spreading layer in an upper portion of the drift region 520. The doping concentration of this current spreading layer may be, for example, about 1.5 to 4.0 times higher than the doping concentration of the remainder of the drift region 520.

P-wells 530 are formed in upper portions of the n-type drift region 520 (or in the current spreading layer, if provided). A JFET region 522 is defined in the upper portion of the drift region 520 between adjacent p-wells 530. The p-wells 530 may include main wells 532 and side wells 534 that are on either side of the main wells 532. The main wells 532 and side wells 534 may be doped identically or may be doped differently. The channel regions 536 for the unit cell 500 are within the side p-wells 534. The channel regions 536 electrically connect n-type source regions 540 (discussed below) to the JFET region 522 when a sufficient bias voltage is applied to the gate electrode 572.

The p-wells 530 are formed via ion implantation. As known to those skilled in the art, ions such as n-type or p-type dopants may be implanted in a semiconductor layer or region by ionizing the desired ion species and accelerating the ions at a predetermined kinetic energy as an ion beam towards the surface of a semiconductor layer in an ion implantation target chamber. Based on the predetermined kinetic energy, the desired ion species may penetrate into the semiconductor layer. The ions will implant at different depths into the semiconductor layer so that the predetermined kinetic energy will provide an implant "profile" with varying ion concentrations as a function of depth. The dopants may comprise, for example, Al$^+$ or N$^+$ ions, although any appropriate dopant ions may be used. In some embodiments, the implantation may be performed at different temperatures such as, for example, temperatures of 75° C. or more.

Figure 6C:
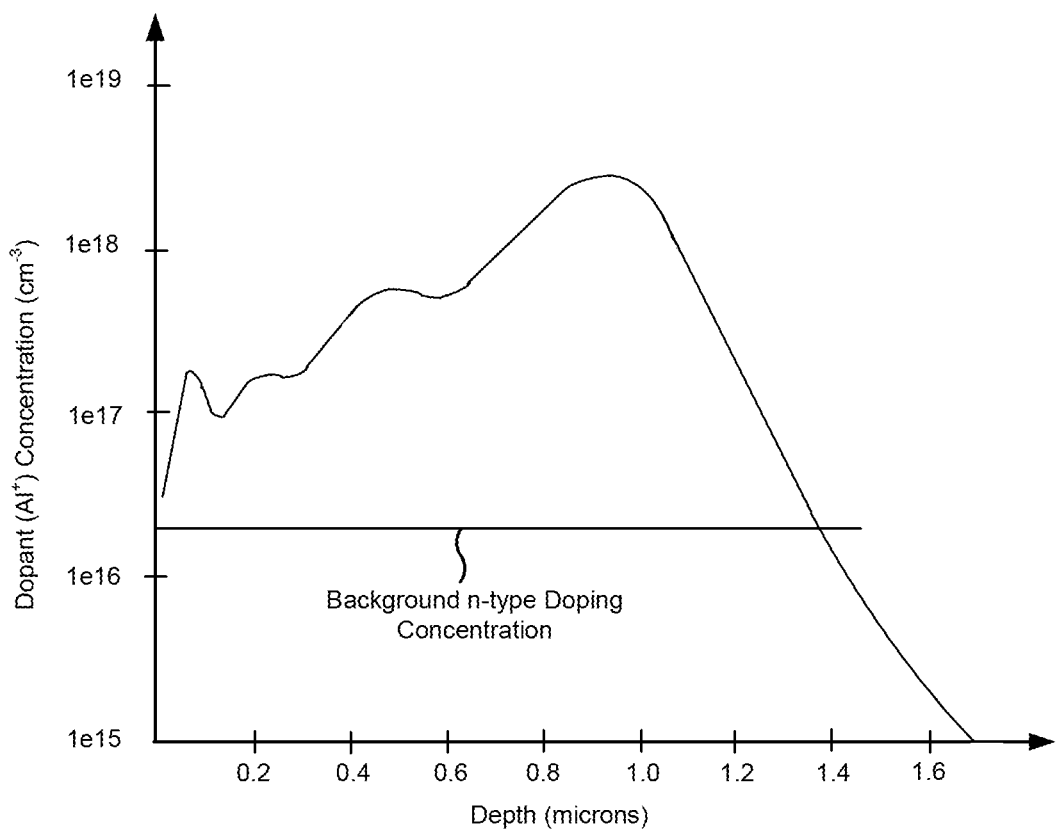
FIG. 6C is a graph showing the doping profile of the channel regions of the unit cell of FIG. 6A-6B as a function of depth.

FIG. 6C is a graph showing an example doping profile of the side wells 534. As shown in FIG. 6C, the side wells 534 are doped to a concentration of about $1 \times 10^{17}$/cm$^3$ near the surface thereof, and the doping concentration generally increases with depth. In the example embodiment shown in FIG. 6C, the doping concentration peaks at about $5 \times 10^{18}$/cm$^3$ at a depth of about 1 micron below the surface of the p-well 530. The doping concentration falls off steeply at depths below about 1 micron, and is below the background n-type doping concentration level of the upper portion of the drift region 520 at a depth of about 1.4 microns.

The doping profile shown in FIG. 6C may be achieved by using higher energy ion implantation. For example, the ion implantation may be performed at implant energies of 500 keV to 2 MeV in example embodiments. These higher implant energies may be used to more heavily dope the lower portion of the side well 534 than the upper portion thereof, and to achieve implant depths of 1.0 microns or more so that the depth of the side p-well 534 may be between 0.8 and 2.0 microns in example embodiments, between 1.0 and 1.7 microns in other example embodiments, and between 1.1 and 1.5 microns in still other example embodiments. The peak doping concentration of the side wells 534 may be between $8 \times 10^{17}$ to $1 \times 10^{19}$ dopants/cm$^3$ in some embodiments, and between $1 \times 10^{18}$ to $8 \times 10^{18}$ dopants/cm$^3$ in other example embodiments. The peak doping concentration may occur at a depth of between 0.7 and 1.5 microns below the top surface of the semiconductor layer structure 550 in some embodiments, and at a depth of between 0.8 and 1.2 microns in other embodiments.

It will be appreciated that the p-wells 530 may be formed using a multi-step ion implantation process. For example, in a first ion implantation step, a relatively low dose of aluminum ions may be implanted at a relatively low implant energy level. In a second ion implantation step, a moderate dose of aluminum ions may be implanted at a moderate implant energy level. In a third ion implantation step, a high dose of aluminum ions may be implanted at a high implant energy level. In some embodiments, the high dose of aluminum ions may be at least one order of magnitude greater than the low dose of aluminum ions, or at least two orders of magnitude greater than the low dose of aluminum ions. In some embodiments, the high dose of aluminum ions may be at least one order of magnitude greater than the moderate dose of aluminum ions. In some embodiments, the high dose of aluminum ions may be implanted using an implant energy that is at least twice, or at least three times, the implant energy used to implant the moderate dose of aluminum ions. In some embodiments, the high dose of aluminum ions may be implanted using an implant energy that is at least four times, at least five times, at least six times, at least seven times or at least eight times the implant energy used to implant the low dose of aluminum ions. Ions other than aluminum may also be used.

As can best be seen in FIG. 6B, the higher doping concentration in the bottom portion of the side wells 534 causes the side p-wells 534 to spread laterally. As a result, an upper portion of the JFET region 522 that is defined between the p-wells 530 is wider than at least part of a lower portion of the JFET region 522. Herein, the upper portion of the JFET region 522 refers to the top half of the JFET region 522, while the lower portion of the JFET region 522 refers to the bottom half of the JFET region 522. For example, as shown in FIG. 6B, the upper portion of the JFET region 522 has a first maximum width $W_1$. While the width of the upper portion of the JFET region 522 is shown as being constant in FIG. 6B, in actual devices the width will typically have some amount of variation, and the width $W_1$ is the maximum width of the upper portion of the JFET region 522. The lower portion of the JFET region 522 has a variable width, and the minimum width $W_2$ of the lower portion of the JFET region 522 is less than maximum width $W_1$ of the upper portion of the JFET region 522. In some embodiments, the maximum width $W_1$ of the upper portion of the JFET region 522 may be between 0.8 and 3.0 microns. In other embodiments, the maximum width $W_1$ of the upper portion of the JFET region 522 may be between 1.0 and 2.0 microns. In still other embodiments, the maximum width $W_1$ of the upper portion of the JFET region 522 may be between 1.0 and 1.5 microns. In some embodiments, the minimum width $W_2$ of the lower portion of the JFET region 522 may be between 0.4 and 1.5 microns. In other embodiments, the minimum width $W_2$ of the lower portion of the JFET region 522 may be between 0.5 and 1.0 microns or between 0.5 and 0.75 microns. In some embodiments, the width $W_2$ may be between 30% and 80% of the width $W_1$. In other embodiments, the width $W_2$ may be between 40% and 60% of the width $W_1$. In some embodiments, a minimum width of the lower half of the JFET region 522 may be between 35% and 90% of an average width of the upper half of the JFET region 522, or between 45% and 65% of an average width of the upper half of the JFET region 522.

As discussed above, the narrowed region in the lower portion of the JFET region 522 may act to increase the specific on-resistance of a device that includes the unit cell 500. In order to counteract the increase in the on-resistance, a deeper JFET region 522 is provided within the device, where the JFET region 522 may be at least as deep as the side p-wells 534. Additionally or alternatively, the doping concentration of the JFET region 522 may be increased above conventional levels. The deeper, more highly doped JFET region 522 may also reduce the value of the specific on-resistance at high temperatures, which helps reduce the rate at which the internal temperature of the device increases under short circuit conditions (i.e., the device has a smaller temperature coefficient). This may further improve the short circuit capabilities of the device. The deeper, more highly doped JFET region 522 may be formed by ion implantation in some embodiments. FIG. 6B illustrates an embodiment where the depth of the JFET region 522 is about the same as the depths of the p-wells 530. FIG. 6E shows a modified version 500' of the unit cell 500 that includes a JFET region 522' having a depth that is about 20% deeper than the depths of the p-wells 530. The embodiment of FIG. 6E may be formed by forming the JFET region 522 by ion implantation prior to formation of the p-wells 530 by ion implantation.

Figure 6D:
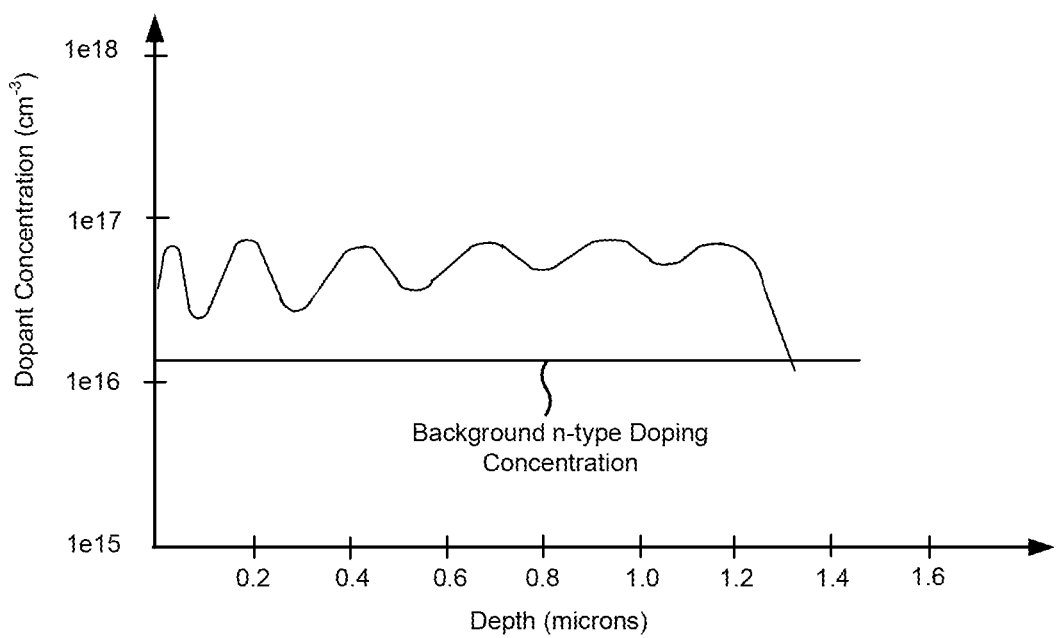
FIG. 6D is a graph showing the doping profile of the JFET regions of the unit cell of FIG. 6A-6B as a function of depth.
Figure 6E:
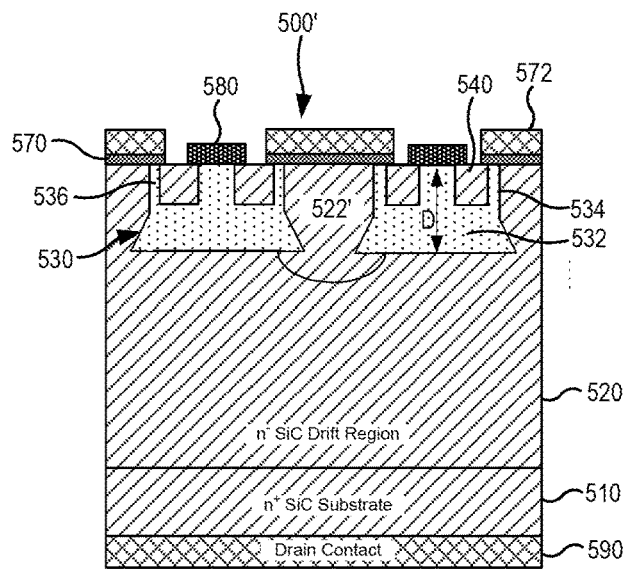
FIG. 6E is a schematic cross-sectional diagram of a modified version of the unit cell of FIG. 6B.

FIG. 6D is a graph showing an example doping profile for the JFET region 522. As shown in FIG. 6D, additional n-type dopants (e.g., nitrogen ions) are implanted into the JFET region 522 at a concentration of about $6 \times 10^{16}/\text{cm}^3$. In the example of FIG. 6D, a total of six ion implantation steps were performed to dope the JFET region 522, each at a different implantation energy, which results in the six peaks shown in FIG. 6D. Implanted nitrogen ions tend to deflect less than aluminum ions within the semiconductor lattice, and hence a larger number of implantation steps were used in an effort to obtain a fairly constant doping profile throughout the JFET region 522 in the example embodiment of FIG. 6D. In this example, the background n-type doping concentration of the drift region 520 is about $2 \times 10^{16}/\text{cm}^3$ so that the JFET region 522 has a doping concentration that is 2-3 times higher the background doping concentration. The doping concentration falls off steeply at depths below about 1.25 microns, and is below the background n-type doping concentration level at a depth of about 1.35 microns. As can be seen by comparing FIGS. 6C and 6D, the depth of the JFET region 522 is approximately equal to the depth of the side p-well 534. The depths of regions formed by ion implantation such as the p-wells 530 (or portions thereof) or the JFET region 522 refers to the depth below the surface of the region (or another reference surface) at which the doping concentration falls to a level equal to the background doping concentration. The background doping concentration may be the same conductivity type or a different conductivity type.

In some embodiments, the depth of the JFET region 522 may be between 0.8 and 1.5 times the depth of the side p-well 534. In some embodiments, the depth of the JFET region 522 may be at between 1.0 and 1.4 times as deep as the depth of the side p-well 534. In still other embodiments, the depth of the JFET region 522 may be at between 1.0 and 1.2 times as deep as the depth of the side p-well 534. In some embodiments, the depth of the JFET region 522 may be between 0.8 and 2.0 microns. In other embodiments, the depth of the JFET region 522 may be between 1.0 and 1.7 microns.

The width of the lower portion of the JFET region may be less than the depth of the JFET region 522. In example embodiments, the width of the lower portion of the JFET region 522 may be less than 40%, less than 50%, less than 60%, less than 70% or less than 80% the depth of the JFET region 522. The width of the upper portion of the JFET region 522 may be more or less than the depth of the JFET region 522. In example embodiments, the width of the upper portion of the JFET region 522 may be between 70% and 130% the depth of the JFET region 522, between 80% and 120% the depth of the JFET region 522, or between 90% and 110% the depth of the JFET region 522.

The main wells 532 and the side wells 534 may be formed in the same process and may have the same p-type doping concentration as a function of depth. It will be appreciated, however, that in other embodiments the main wells 532 and the side wells 534 may be formed to have different doping profiles. For example, an additional shallow ion implantation may be performed in order to increase the p-type dopant concentration in the upper portion of the main wells 532 to between $5 \times 10^{18}/cm^3$ and $5 \times 10^{19}/cm^3$.

After the p-wells 530 are formed, heavily-doped ($n^+$) n-type silicon carbide source regions 540 may be formed in upper portions of the p-wells 530. The n-type source regions 540 may be formed by ion implantation. The substrate 510, the drift region 520 (including the JFET region 522 and any current spreading layer), the p-wells 530 and the source regions 540 together comprise a semiconductor layer structure 550.

The ion implantation steps used to form the p-wells 530, the JFET region 522 and the source regions 540 may be performed in any appropriate order. For example, the ion implantation into the JFET region 522 may occur before or after the formation of the p-well 530. Typically the p-wells 530 are formed before the heavily-doped ($n^+$) n-type silicon carbide source regions 540, although this need not be the case.

After the n-type source regions 540 are formed, a gate insulating layer 570 may be formed on the upper surface of the semiconductor layer structure 550. The gate insulating layer 570 may be formed directly on the semiconductor layer structure 550 with no intervening n-type epitaxial layer. The gate insulating layer 570 may comprise, for example, a silicon oxide layer, although other insulating materials may be used. A gate electrode 572 is formed on the gate insulating layer 570. The gate electrode 572 may comprise, for example, a conductive gate finger that serves as a gate electrode for a plurality of the unit cell transistors 500.

Source contacts 580 may be formed on the heavily-doped n-type source regions 540 and the well regions 530. While not shown to simplify the drawing, the source contacts 580 may be part of a continuous source pattern 432 that extends across the upper surface of the silicon carbide semiconductor layer structure of the MOSFET 410 (see FIG. 5A). The source contacts 580 may comprise, for example, metals such as nickel, titanium, tungsten and/or aluminum, and/or alloys and/or thin layered stacks of these and/or similar materials. A drain contact 590 may be formed on the lower surface of the substrate 510. The drain contact 590 may comprise, for example, similar materials to the source contact, as this forms an ohmic contact to the silicon carbide substrate.

The deep, highly-doped p-wells 530 and the narrowing at least part of the lower portion of the JFET region 522 may provide enhanced shielding as compared to conventional devices. This enhanced shielding may reduce the electric field values in the JFET region 522 and in the gate insulating layer 570 during on-state operation. Since one known failure mechanisms for power MOSFETs and other gate-controlled switching devices is breakdown of the gate insulating layer 570 due to extended exposure to high electric fields, the improved shielding may increase the lifetime, and hence the reliability, of the devices according to embodiments of the present invention. In addition, the enhanced shielding helps to shield the gate electrode 572 from the drain contact 590, resulting in lower intrinsic gate-to-drain capacitance levels for the device, which can improve the high frequency switching performance of devices that include the unit cell 500.

The reduced width of the lower portion of the JFET region 522 increases the size of the depletion region when the device operates under short circuit conditions, which improves the pinch-off effect, thereby reducing the level of the saturation drain current. Thus, the short-circuit capabilities of the device may be improved as compared to conventional devices. The increased depth and doping concentration of the JFET region 522 may help offset any increase in the specific on-resistance of the device that may occur as a result of the provision of the deeper, more-highly doped side p-wells 534. The deeper, more highly doped JFET region 522 may also reduce the value of the specific on-resistance at high temperatures, which helps reduce the rate at which the internal temperature of the device increases under short circuit conditions (i.e., the device has a smaller temperature coefficient). This may further improve the short circuit capabilities of the device.

While the unit cell transistor 500 is an n-type device with the source contacts 580 on an upper surface thereof and the drain contact 590 on the bottom surface thereof, it will be appreciated that in p-type devices these locations are reversed. Accordingly, in portions of the descriptions below (including the claims) the source contacts and drain contacts may be generically referred to as "source/drain contacts," which term generically refers to either a source contact or a drain contact.

In the above-described example unit cell 500, a doping concentration of the JFET region 522 may exceed a doping concentration of the silicon carbide drift region 520. The minimum width $W_1$ of an upper portion of the JFET region 522 may be greater than a minimum width $W_2$ of the lower portion of the JFET region 522. A depth of the first side well 534 may be at least 1.0 micron, and a depth of the JFET region 522 may equal or exceed a depth of the first side well 534 (e.g., the depth of the JFET region 522 may be between 1.0 and 1.2 times a depth of the first side well 534). For example, the depth of the first side well 534 may be between 1 and 1.5 microns and the depth of the JFET region 522 may be between 1 and 1.7 microns, and may equal or exceed the depth of the first side well 534. The minimum width $W_1$ of the upper portion of the JFET region 522 may be at least 50% greater than the minimum width $W_2$ of the lower portion of the JFET region 522 in some embodiments.

A peak doping concentration of the first side well 534 may exceed $5 \times 10^{17}/cm^3$ and may occur at a depth of between 0.8 and 1.2 microns below the upper surface of the semiconductor layer structure 550. Additionally, a peak doping concentration of the upper 0.2 microns of the first side well 534 may be at least an order of magnitude less than a peak doping concentration of the first side well 534. The peak doping concentration of the first side well 534 may occur at a first depth from the upper surface of the semiconductor layer structure 550, and the doping concentration of the JFET region 522 at the first depth may be at least an order of magnitude lower than the peak doping concentration of the first side well 534.

Figure 7:
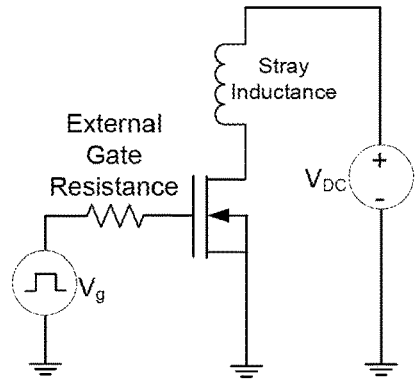
FIG. 7 is a circuit diagram illustrating the conditions used for a test of the short circuit capability of a power MOSFET.

FIG. 7 is a circuit diagram illustrating a MOSFET under short circuit conditions. As shown in FIG. 7, a power MOSFET may have its source terminal coupled to ground, and a high direct current (DC) voltage ($V_{DC}$) applied to the drain terminal. As an example, the value of $V_{DC}$ may be 800

Volts or some other high value. If under these conditions, a voltage $V_g$ that exceeds the threshold voltage for the device is applied to the gate electrode, the device starts to conduct, and the drain current increases rapidly in light of the large voltage difference between the source and drain terminals. As described above, power dissipation within the device structure increases with the increasing drain current, rapidly heating the device, typically resulting in permanent device failure if the short circuit condition is not quickly rectified.

Figure 8:
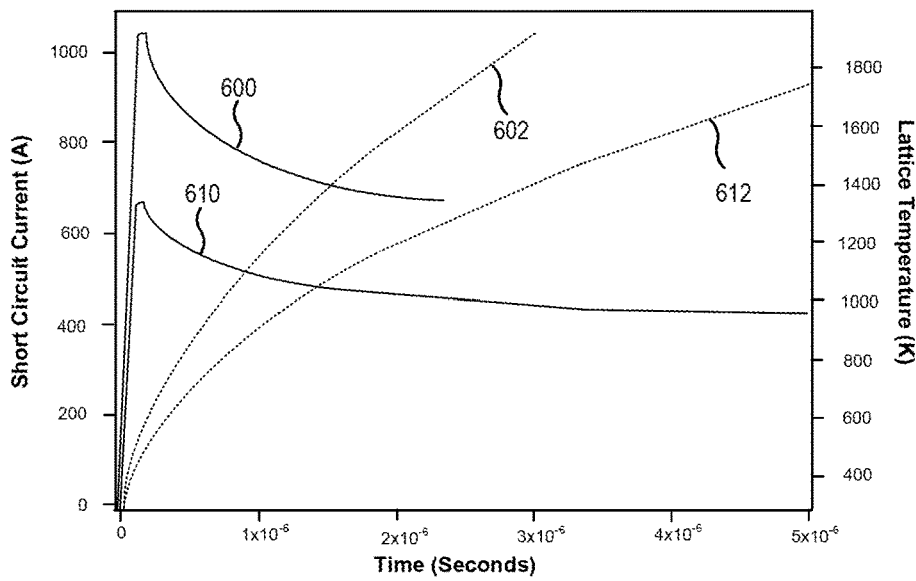
FIG. 8 is a graph illustrating the simulated drain current and lattice temperature as a function of time for both a conventional MOSFET and a MOSFET according to embodiments of the present invention.

FIG. 8 is a graph illustrating the simulated drain current and lattice temperature as a function of time for both a conventional MOSFET (curves 600 and 602) and a MOSFET according to embodiments of the present invention (curves 610 and 612) operating under short circuit conditions. As shown by curve 600, the drain current in the conventional device quickly rises to about 1050 Amps, and then decreases as the pinch-off effects due to depletion within the JFET region cause the drain current to saturate. As shown by curve 602, the temperature within the conventional MOSFET increases to nearly 2000 K within $3\times10^{-6}$ seconds of the short circuit condition occurring. In contrast, as shown by curve 610, the drain current in the MOSFET according to embodiments of the present invention only rises to about 675 Amps, before decreasing as the drain current saturates, and the temperature within the device (curve 612) only increases to about 1500 K within $3\times10^{-6}$ seconds of the short circuit condition occurring. This shows that the semiconductor devices according to embodiments of the present invention may exhibit improved short circuit capabilities.

Figure 9A:
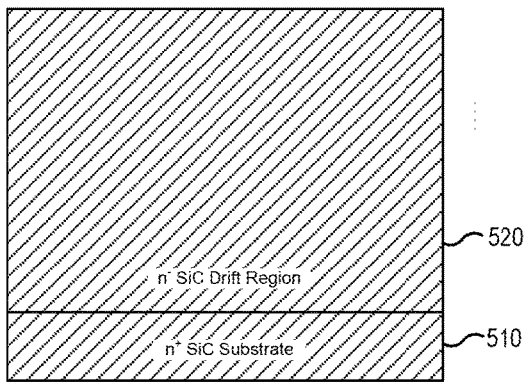
FIGS. 9A-9F are schematic cross-sectional diagrams illustrating a method of fabricating a power MOSFET according to embodiments of the present invention.

FIGS. 9A-9F are schematic cross-sectional diagrams illustrating a method of fabricating a power MOSFET according to embodiments of the present invention. As shown in FIG. 9A, a lightly-doped n-type (n⁻) silicon carbide drift region 520 may be formed on a substrate 510. The substrate 510 may be a silicon carbide semiconductor substrate 510 such as a single crystal 4H silicon carbide semiconductor substrate that is heavily-doped with n-type impurities. The n-type silicon carbide drift region 520 may be formed by epitaxial growth and may have, for example, a doping concentration of $1\times10^{14}$ to $5\times10^{16}$ dopants/cm³. An upper portion of the n-type silicon carbide drift region 520 (e.g., the top 2-3 microns) may be more heavily doped than the remainder of the drift region 520 to form a current spreading layer in the upper portion of the drift region 520.

Figure 9B:
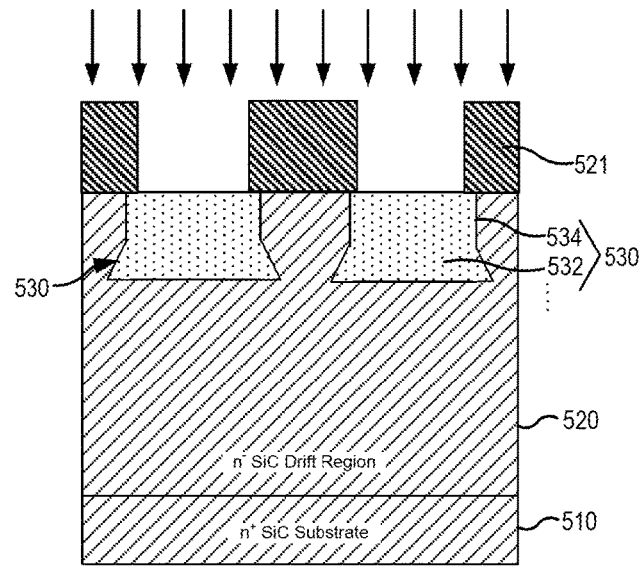

As shown in FIG. 9B, p-wells 530 are formed in upper portions of the n-type drift region 520 via ion implantation. A mask 521 (e.g., a thick oxide layer) is formed on the upper surface of the drift region 520. P-type dopants are then implanted via ion implantation using the mask 521 as an ion implantation mask. A multi-step implant may be used to achieve a desired doping profile. For example, a low energy implant at a low dose (e.g., $1\times10^{12}$ at 50 keV) may be used to form the upper portion of the p-well 530, and then a moderate energy implant at a low-to-moderate dose (e.g., $2\times10^{12}$ at 100 keV) may be used to form a middle portion (in the depth direction) of the p-well 530. A high energy implant at a high dose (e.g., $1\times10^{14}$ at 500 keV) may be used to form a lower portion of the p-well 530. As shown in FIG. 9B, due to scattering effects, the p-wells 530 will extend laterally beyond the openings formed in the mask 521. The more highly-doped lower portions of the p-wells 530 may extend farther laterally than the lower-doped middle and upper regions of the p-wells 530. While not shown in the drawings, the mask 521 may be removed and replaced with a second mask having narrower openings, and the an additional low energy implant at a high dose (e.g., $1\times10^{14}$ at 50 keV) may be used to significantly increase the doping concentration of the upper portion of the main p-wells 532 without impacting the doping concentration of the side p-wells 534.

Figure 9C:
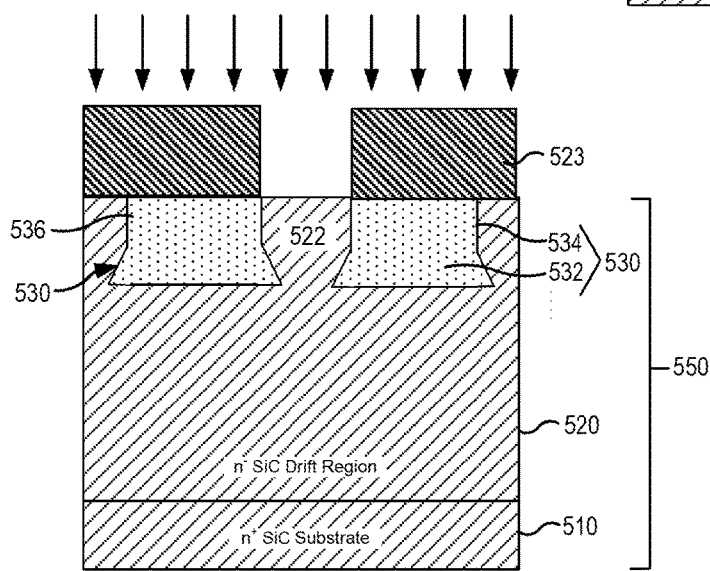

As shown in FIG. 9C, the ion implantation mask(s) that were used to form the p-wells 530 are removed and replaced with a mask 523 that exposes the portion of the drift region 520 that is between the p-wells 530. N-type dopants are then implanted into this region using the mask 523 as an ion implantation mask. Once again, a multi-step ion implantation process may be used (e.g., 3-10 steps). The ion implantation steps may use different implantation energies but relatively similar doses in order provide an implant that increases the n-type dopant concentration in the portion of the drift region 520 that is between the p-wells 530 to form the JFET region 522. As noted above, a depth of the JFET region 522 may be equal to or greater than depths of the p-wells 530.

Figure 9D:
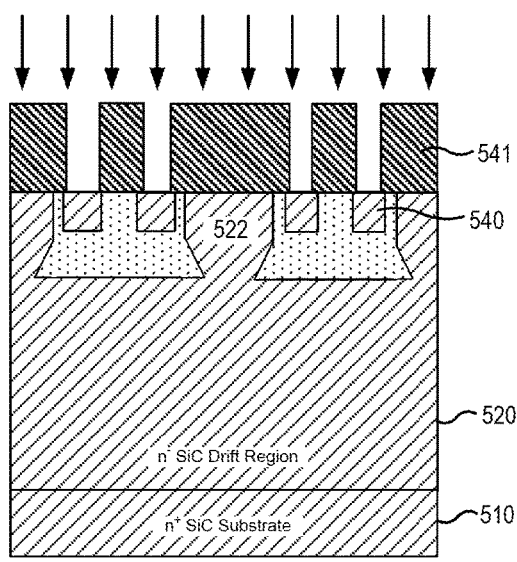
Figure 9E:
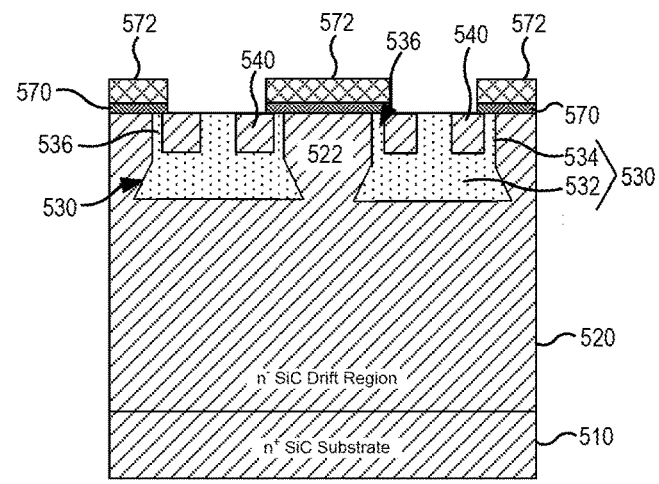
Figure 9F:
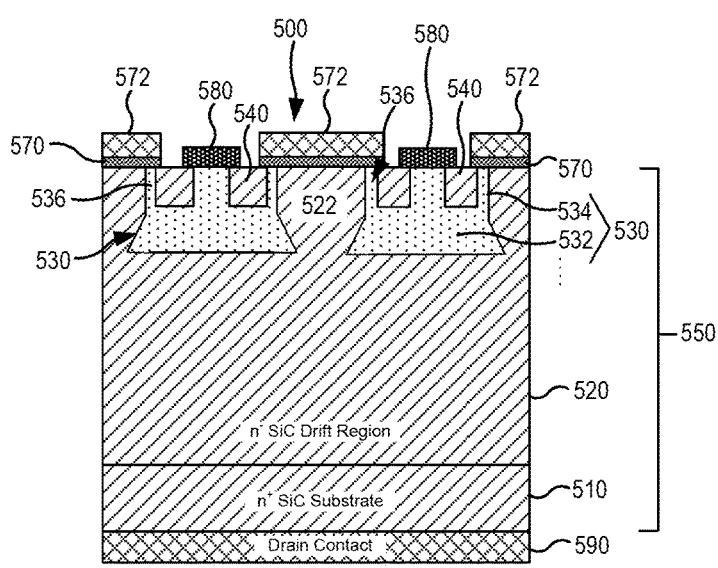

As shown in FIG. 9D, the ion implantation mask that was used to form the JFET region 522 is removed and replaced with a mask 541 that exposes selected portions of the main p-wells 532. N-type dopants are then implanted into these regions using the mask 541 as an ion implantation mask. Finally, as shown in FIGS. 9E and 9F, a gate insulating layer 570, a gate electrode 572 and source and drain contacts 580, 590 may be formed to complete the device.

While the above discussion focuses on n-channel MOSFETs, it will be appreciated that pursuant to further embodiments of the present invention, the polarity of each of the semiconductor layers in each device could be reversed so as to provide corresponding p-channel MOSFETs. Likewise, while the embodiments of the present invention discussed above are MOSFETs, it will be appreciated that the techniques disclosed herein may also be used to form insulated gate bipolar junction transistors (IGBTs) that include a MOSFET according to embodiments of the present invention, or other gate controlled power semiconductor devices.

While in the embodiments described above the JFET region 522 is formed via ion implantation, it will be appreciated that in other embodiments the JFET region 522 may be formed by more highly doping the upper portion of the drift region 520, which may eliminate the need for an extra ion implantation step. However, care may need to be taken if the more highly-doped JFET region 522 is formed during the growth of the drift region 520 to make sure that high electric fields at the edge terminations of the device do not reduce the blocking characteristics of the device.

Herein, embodiments of the present invention are described with respect to cross-sectional diagrams that show one or two unit cells of a power switching devices. It will be appreciated that actual implementations will typically include a much larger number of unit cells. However, it will also be appreciated that the present invention is not limited to such devices, and that the claims appended hereto also cover MOSFETs and other power switching devices that comprise, for example, a single unit cell. Moreover, while the present disclosure focuses on silicon carbide devices, it will be appreciated that embodiments of the present invention may also have applicability to devices formed using other wide band-gap semiconductors such as, for example, gallium nitride, zinc selenide or any other II-VI or III-V wide band-gap compound semiconductors.

The invention has been described above with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or elements, these regions, layers and/or elements should not be limited by these terms. These terms are only used to distinguish one region, layer or element from another region, layer or element. Thus, a first region, layer or element discussed below could be termed a second region, layer or element, and similarly, a second region, layer or element may be termed a first region, layer or element without departing from the scope of the present invention.

Relative terms, such as "lower" or "bottom" and "upper" or "top," may be used herein to describe one element's relationship to another element as illustrated in the drawings. It will be understood that relative terms are intended to encompass different orientations of the device in addition to the orientation depicted in the drawings. For example, if the device in the drawings is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including," when used herein, specify the presence of stated features, elements, and/or components, but do not preclude the presence or addition of one or more other features, elements, components, and/or groups thereof.

Embodiments of the invention are described herein with reference to cross-sectional illustrations that are schematic illustrations. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

It will be understood that the embodiments disclosed herein can be combined. Thus, features that are pictured and/or described with respect to a first embodiment may likewise be included in a second embodiment, and vice versa.

While the above embodiments are described with reference to particular figures, it is to be understood that some embodiments of the present invention may include additional and/or intervening layers, structures, or elements, and/or particular layers, structures, or elements may be deleted. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A power semiconductor device, comprising:
    a semiconductor layer structure that includes:
        a silicon carbide drift region having a first conductivity type;
        a first well located in an upper portion of the silicon carbide drift region, the first well doped with dopants having a second conductivity type that is different than the first conductivity type;
        a second well located in the upper portion of the silicon carbide drift region, the second well spaced apart from the first well, the second well doped with dopants having the second conductivity type;
        a JFET region that has a doping concentration of first conductivity type dopants that exceeds a doping concentration of first conductivity type dopants in the silicon carbide drift region;
        the JFET region at least partly between the first well and the second well and has a JFET depth defined from an upper surface of the semiconductor layer structure; and
    wherein a maximum width of an upper half of the JFET region is at least 30% larger than a minimum width of a lower half of the JFET region, and
    wherein the minimum width of the lower half of the JFET region is less than 50% of the JFET depth.

2. The power semiconductor device of claim 1, wherein the first well includes a first main well and a first side well that is between the first main well and the JFET region, the first side well including a first channel region,
    wherein the second well includes a second main well and a second side well that is between the second main well and the JFET region, the second side well including a second channel region.

3. The power semiconductor device of claim 2, wherein a depth of the first side well from an upper surface of the semiconductor layer structure is at least 1.0 micron and the JFET depth is between 1.0 and 1.7 microns.

4. The power semiconductor device of claim 3, further comprising:

a first source/drain contact on a lower surface of the silicon carbide drift region;

a source/drain region having the first conductivity type in an upper portion of the first main well and extending to an upper surface of the first well;

a second source/drain contact on an upper surface of the source/drain region;

a gate insulating layer on the JFET region and on the first well; and a gate electrode on the gate insulating layer.

5. The power semiconductor device of claim 4, wherein the depth equals or exceeds a depth of the first side well from the upper surface of the semiconductor layer structure.

6. The power semiconductor device of claim 2, wherein a peak doping concentration of the first side well exceeds $5 \times 10^{17}/cm^3$ and occurs at a depth of between 0.8 and 1.2 microns below an upper surface of the semiconductor layer structure.

7. The power semiconductor device of claim 6, wherein the JFET depth is between 1.0 and 1.2 times a depth of the first side well from the upper surface of the semiconductor layer structure.

8. The power semiconductor device of claim 1, wherein the maximum width of the upper half of the JFET region is at least 50% greater than the minimum width of the lower half of the JFET region.

9. The power semiconductor device of claim 2, wherein a depth of the first side well is between 1.0 and 1.5 microns from an upper surface of the semiconductor layer structure, the JFET depth is between 1.0 and 1.7 microns and the JFET depth is at least as deep as the depth of the first side well.

10. The power semiconductor device of claim 1, wherein the maximum width of the upper half of the JFET region is between 40% and 80% larger than the minimum width of the lower half of the JFET region.

11. A power semiconductor device, comprising:
a semiconductor layer structure that includes:
a silicon carbide drift region having a first conductivity type;
a first well located in an upper portion of the silicon carbide drift region, the first well doped with dopants having a second conductivity type that is different than the first conductivity type, the first well including a first channel region;
a second well located in the upper portion of the silicon carbide drift region, the second well spaced apart from the first well to define a JFET region of the silicon carbide drift region that is between the first well and the second well, the second well doped with dopants having the second conductivity type, the second well including a second channel region;
a first source/drain contact on a lower surface of the silicon carbide drift region;
a second source/drain contact on an upper surface of the silicon carbide drift region that is opposite the lower surface of the silicon carbide drift region,
wherein a maximum distance between the first well and the second well in an upper half of the JFET region is greater than a minimum distance between the first well and the second well in a lower half of the JFET region,
wherein a doping concentration of the JFET region exceeds a doping concentration of the silicon carbide drift region and a depth of the first well from an upper surface of the semiconductor layer structure is at least 1.0 micron, and wherein a peak doping concentration of the first well exceeds a doping concentration of the first well at a depth of 0.2 microns from an upper surface of the semiconductor layer structure by at least an order of magnitude.

12. The power semiconductor device of claim 11, wherein the depth of the first well from the upper surface of the semiconductor layer structure is between 1.0 and 1.6 microns.

13. The power semiconductor device of claim 11, wherein a depth of the JFET region from the upper surface of the semiconductor layer structure is less than 1.2 times the depth of the first well from the upper surface of the semiconductor layer structure.

14. The power semiconductor device of claim 11, wherein a peak doping concentration of the first well occurs at a first depth from the upper surface of the semiconductor layer structure, and wherein a doping concentration of the JFET region at the first depth from the upper surface of the semiconductor layer structure is at least an order of magnitude lower than the peak doping concentration of the first well.

15. A power semiconductor device, comprising:
a semiconductor layer structure that includes:
a silicon carbide drift region having a first conductivity type;
a first well located in an upper portion of the silicon carbide drift region, the first well doped with dopants having a second conductivity type that is different than the first conductivity type, the first well including a first side well region;
a second well located in the upper portion of the silicon carbide drift region, the second well spaced apart from the first well, the second well doped with dopants having the second conductivity type, the second well including a second side well region;
a JFET region in the silicon carbide drift region between the first well and the second well, the JFET region having a doping concentration of dopants having the first conductivity type that exceeds a doping concentration of the silicon carbide drift region, and
wherein a peak doping concentration of the first side well region occurs at a first depth from an upper surface of the semiconductor layer structure, and the doping concentration of the JFET region at the first depth is at least an order of magnitude lower than the peak doping concentration of the first side well region, and
wherein a maximum width of an upper half of the JFET region is at least 30% larger than a minimum width of a lower half of the JFET region, the minimum width of the lower half of the JFET region is between 0.5 and 1.0 microns, and a depth of the JFET region is between 1.0 and 1.7 microns from the upper surface of the semiconductor layer structure.

16. The power semiconductor device of claim 15, wherein the depth of the JFET region from the upper surface of the semiconductor layer structure exceeds a depth of the first well from the upper surface of the semiconductor layer structure.

17. The power semiconductor device of claim 16, wherein the depth of the JFET region from the upper surface of the semiconductor layer structure is less than 1.2 times the depth of the first well from the upper surface of the semiconductor layer structure.

18. The power semiconductor device of claim 16, wherein a peak doping concentration of an upper 0.2 microns of the first well is at least an order of magnitude less than the peak doping concentration of the first well.

19. The power semiconductor device of claim 16, wherein the maximum width of the upper half of the JFET region is at least 50% greater than the minimum width of the lower half of the JFET region.

20. The power semiconductor device of claim 16, wherein the JFET region comprises an implanted region that is implanted with the first conductivity type dopants.

21. The power semiconductor device of claim 11, wherein a depth of the JFET region from the upper surface of the semiconductor layer structure exceeds a depth of the first well from the upper surface of the semiconductor layer structure.

22. The power semiconductor device of claim 16, wherein the peak doping concentration of the first well exceeds $5 \times 10^{17}/cm^3$ and occurs at a depth of between 0.7 and 1.2 microns below the upper surface of the semiconductor layer structure.

23. The power semiconductor device of claim 2, wherein a depth of the first side well is between 1.0 and 1.7 microns and a peak doping concentration of the first side well is between $8 \times 10^{17}/cm^3$ and $1 \times 10^{19}/cm^3$ and occurs at a depth of between 0.7 microns and 1.5 microns.

24. The power semiconductor device of claim 15, wherein a maximum distance between the first well and the second well in an upper half of the JFET region is greater than a minimum distance between the first well and the second well in a lower half of the JFET region.

25. A power semiconductor device, comprising:
a semiconductor layer structure that comprises:
    a silicon carbide drift region having a first conductivity type;
    a first well located in an upper portion of the silicon carbide drift region, the first well doped with dopants having a second conductivity type that is different than the first conductivity type, the first well including a first side well region;
    a second well located in the upper portion of the silicon carbide drift region, the second well spaced apart from the first well, the second well doped with dopants having the second conductivity type, the second well including a second side well region;
    a JFET region in the silicon carbide drift region between the first well and the second well, the JFET region having a doping concentration of dopants having the first conductivity type that exceeds a doping concentration of the silicon carbide drift region,
wherein a peak doping concentration of the first side well region occurs at a first depth from an upper surface of the semiconductor layer structure, and the doping concentration of the JFET region at the first depth is at least an order of magnitude lower than the peak doping concentration of the first side well region,
wherein a depth of the first side well is between 1.0 and 1.7 microns and a peak doping concentration of the first side well is between $8 \times 10^{17}/cm^3$ and $1 \times 10^{19}/cm^3$ and occurs at a depth of between 0.7 microns and 1.5 microns.

26. A power semiconductor device, comprising:
a semiconductor layer structure that comprises:
    a silicon carbide drift region having a first conductivity type;
    a first well located in an upper portion of the silicon carbide drift region, the first well doped with dopants having a second conductivity type that is different than the first conductivity type; and
    a second well located in the upper portion of the silicon carbide drift region, the second well spaced apart from the first well to define a JFET region of the silicon carbide drift region that is between the first well and the second well, the second well doped with dopants having the second conductivity type,
wherein a maximum distance between the first well and the second well in an upper half of the JFET region is greater than a minimum distance between the first well and the second well in a lower half of the JFET region,
wherein a depth of the first side well is between 1.0 and 1.7 microns and a peak doping concentration of the first side well is between $8 \times 10^{17}/cm^3$ and $1 \times 10^{19}/cm^3$ and occurs at a depth of between 0.7 microns and 1.5 microns.

27. The power semiconductor device of claim 26, wherein the first well includes a first channel region and the second well includes a second first channel region, the semiconductor layer structure further comprising:
    a first source/drain contact on a lower surface of the silicon carbide drift region; and
    a second source/drain contact on an upper surface of the silicon carbide drift region that is opposite the lower surface of the silicon carbide drift region.

* * * * *